United States Patent
Negoro et al.

(10) Patent No.: US 9,403,187 B2
(45) Date of Patent: Aug. 2, 2016

(54) SUBSTRATE PROCESSING METHOD AND SUBSTRATE PROCESSING APPARATUS

(71) Applicant: DAINIPPON SCREEN MFG. CO., LTD., Kyoto (JP)

(72) Inventors: Sei Negoro, Kyoto (JP); Ryo Muramoto, Kyoto (JP); Yasuhiko Nagai, Kyoto (JP); Tsutomu Osuka, Kyoto (JP); Keiji Iwata, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 0 days.

(21) Appl. No.: 14/475,015

(22) Filed: Sep. 2, 2014

(65) Prior Publication Data
US 2015/0060406 A1    Mar. 5, 2015

(30) Foreign Application Priority Data
Sep. 2, 2013    (JP) .................................. 2013-181509

(51) Int. Cl.
| | |
|---|---|
| B44C 1/22 | (2006.01) |
| B05D 3/10 | (2006.01) |
| B05D 1/36 | (2006.01) |
| H01L 21/67 | (2006.01) |

(52) U.S. Cl.
CPC *B05D 3/105* (2013.01); *B05D 1/36* (2013.01); *H01L 21/67028* (2013.01); *H01L 21/67051* (2013.01)

(58) Field of Classification Search
CPC . H01J 37/3925; B05D 3/105; B05C 11/1002; B05C 11/1042; H01L 21/67051
USPC .......... 216/83, 91, 93, 99; 134/1.1, 1.2, 95.1, 134/95.2, 95.3; 156/345.24, 345.29; 438/748, 749
See application file for complete search history.

(56) References Cited

U.S. PATENT DOCUMENTS

| 7,884,028 | B2 * | 2/2011 | Chen .......................... C23F 1/08 156/345.1 |
| 8,454,754 | B2 * | 6/2013 | Shibata et al. ................... 134/19 |
| 2011/0143550 | A1 * | 6/2011 | Saito ............................. 438/750 |
| 2013/0014784 | A1 * | 1/2013 | Ito et al. .......................... 134/10 |

FOREIGN PATENT DOCUMENTS

| JP | 5-121388 | 5/1993 |
| JP | 2007-324548 | 12/2007 |
| JP | 2008-066400 | 3/2008 |
| JP | 2009-238862 | 10/2009 |
| JP | 2012-156264 | 8/2012 |

(Continued)

*Primary Examiner* — Lan Vinh
(74) *Attorney, Agent, or Firm* — Ostrolenk Faber LLP

(57) ABSTRACT

A substrate processing method includes an SPM supplying step of supplying SPM having high temperature to an upper surface of a substrate, a DIW supplying step of supplying, after the SPM supplying step, DIW having room temperature to the upper surface of the substrate to rinse off the liquid remaining on the substrate, a hydrogen peroxide water supplying step of supplying, after the SPM supplying step and before the DIW supplying step, hydrogen peroxide water of a liquid temperature lower than the temperature of the SPM and not less than room temperature, to the upper surface of the substrate in a state where the SPM remains on the substrate, and a temperature decrease suppressing step of supplying, in parallel to the hydrogen peroxide water supplying step, pure water having high temperature to a lower surface of the substrate.

7 Claims, 17 Drawing Sheets

(56) References Cited

FOREIGN PATENT DOCUMENTS

| JP | 2013-065823 | 4/2013 |
| JP | 2013-521658 | 6/2013 |
| WO | WO 2011/109540 A1 | 9/2011 |
| WO | WO 2013/031390 A1 | 3/2013 |

* cited by examiner

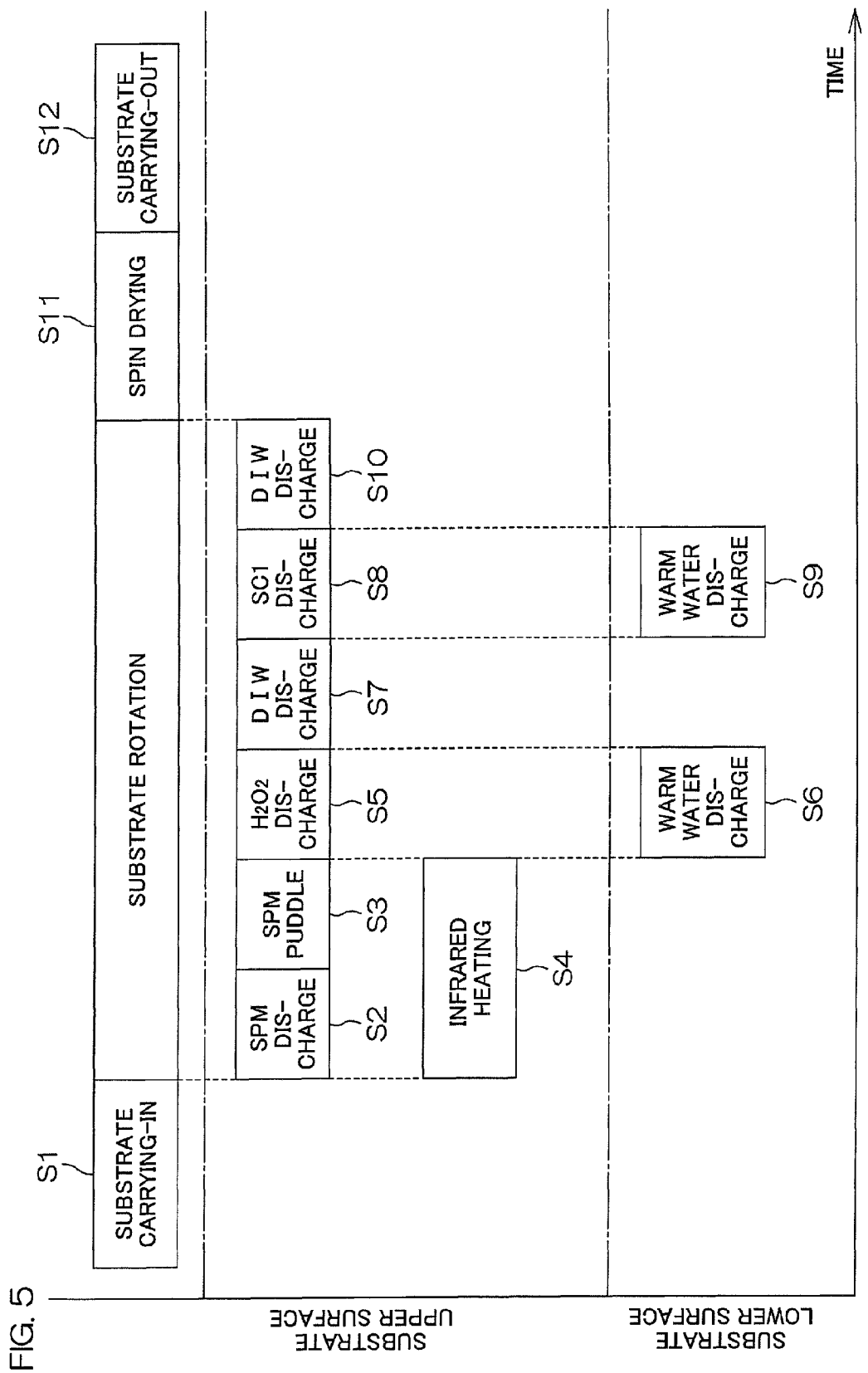

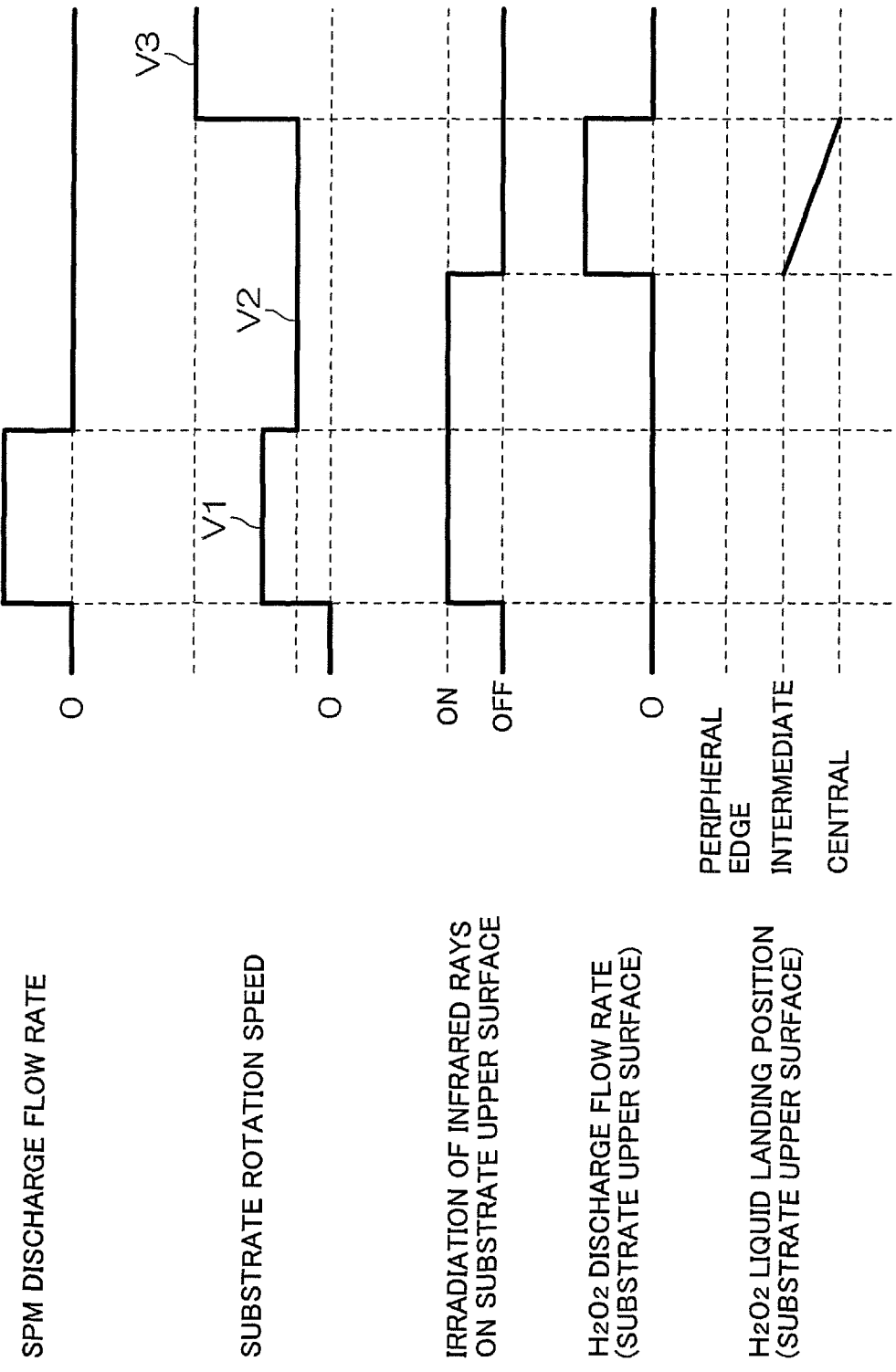

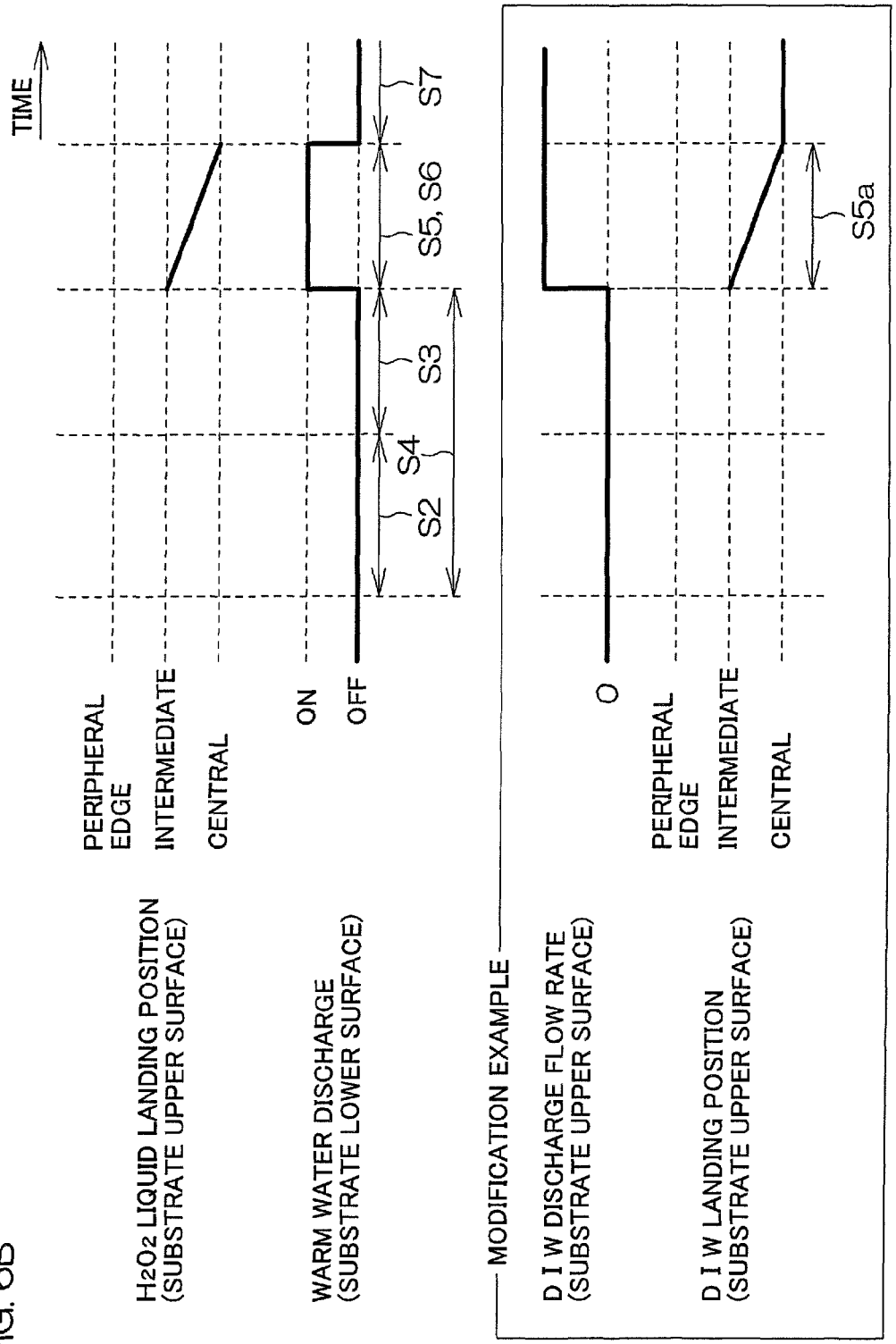

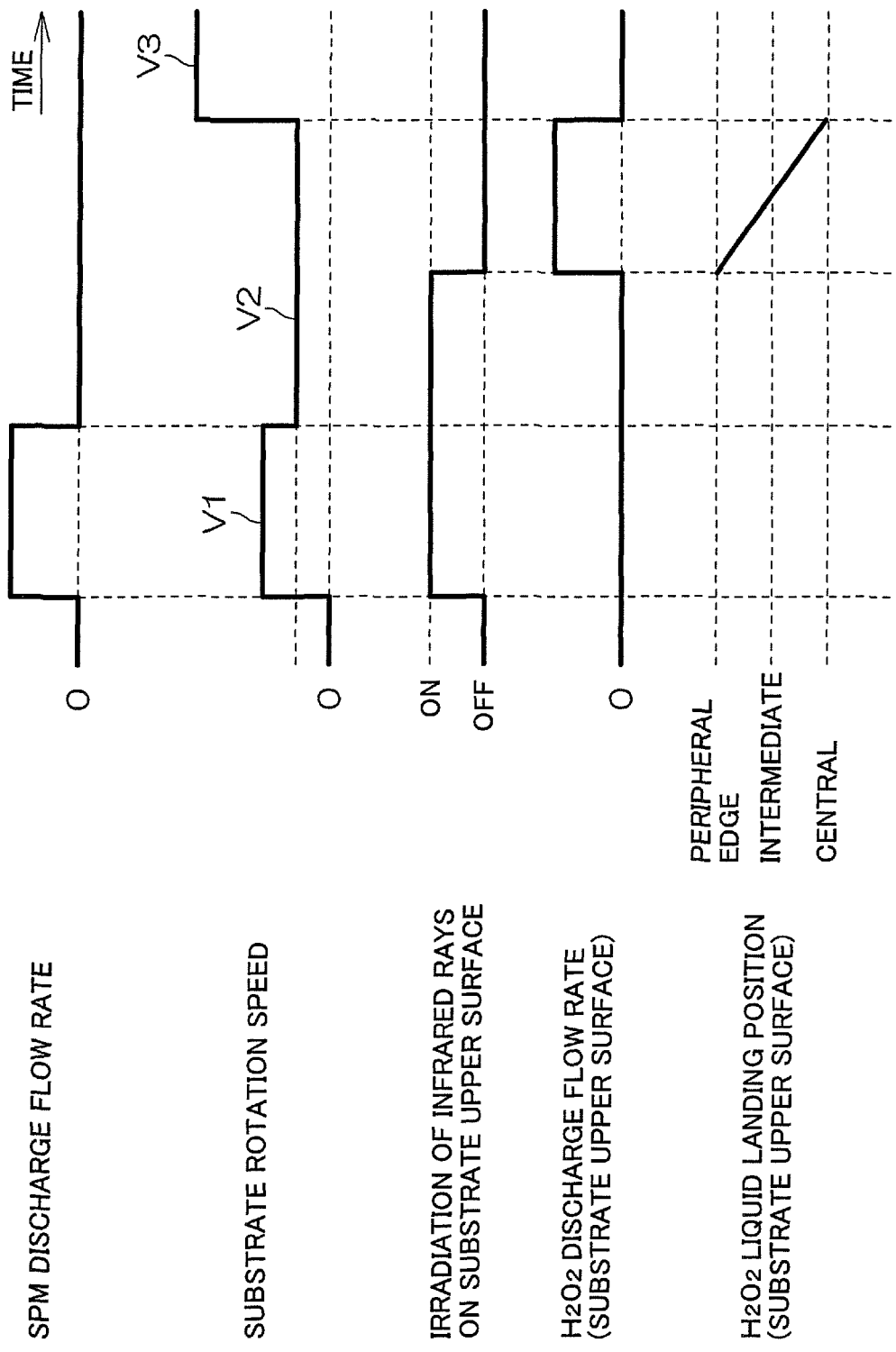

DIRECTION OF URGING BY SPRINGS

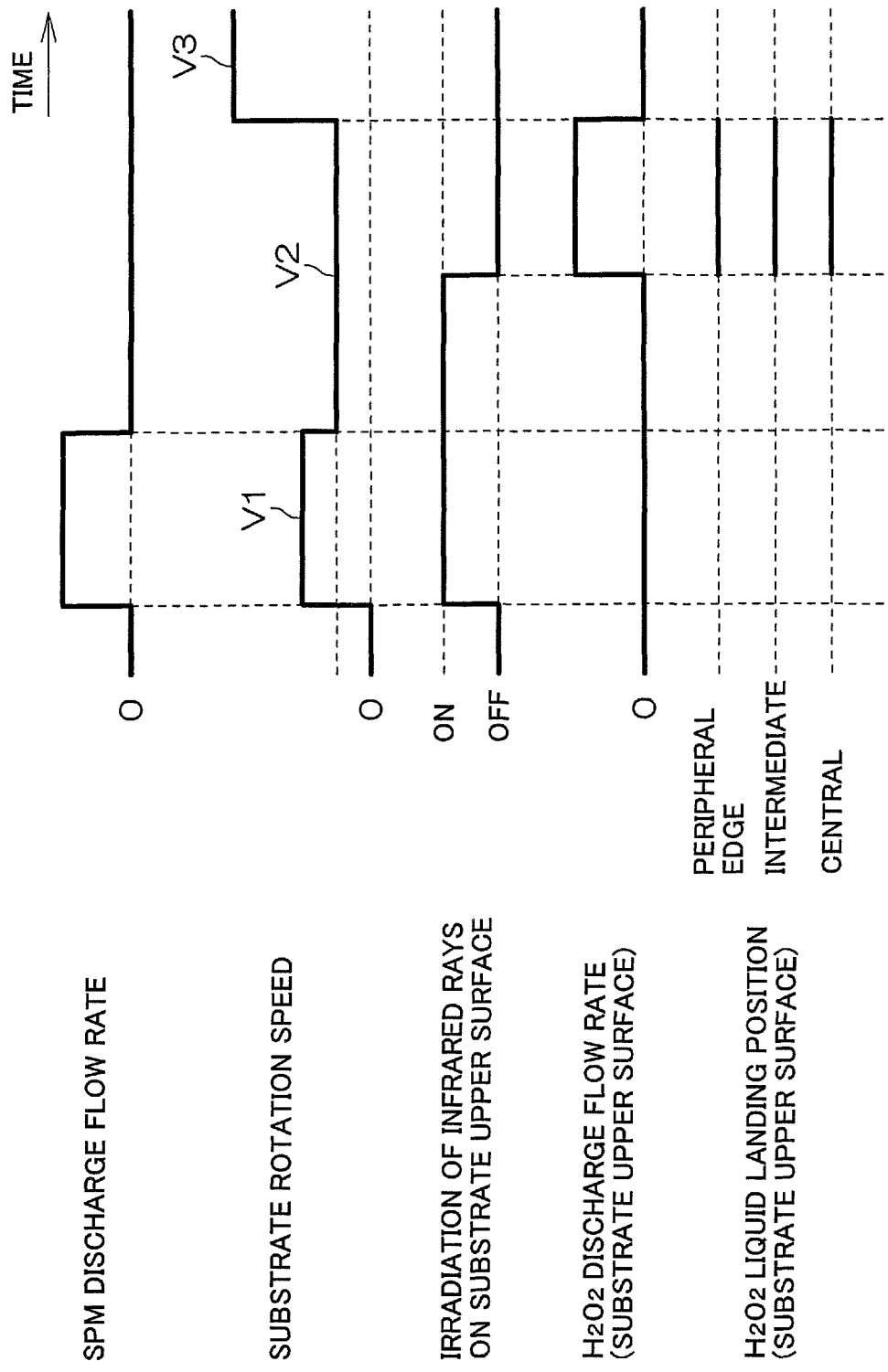

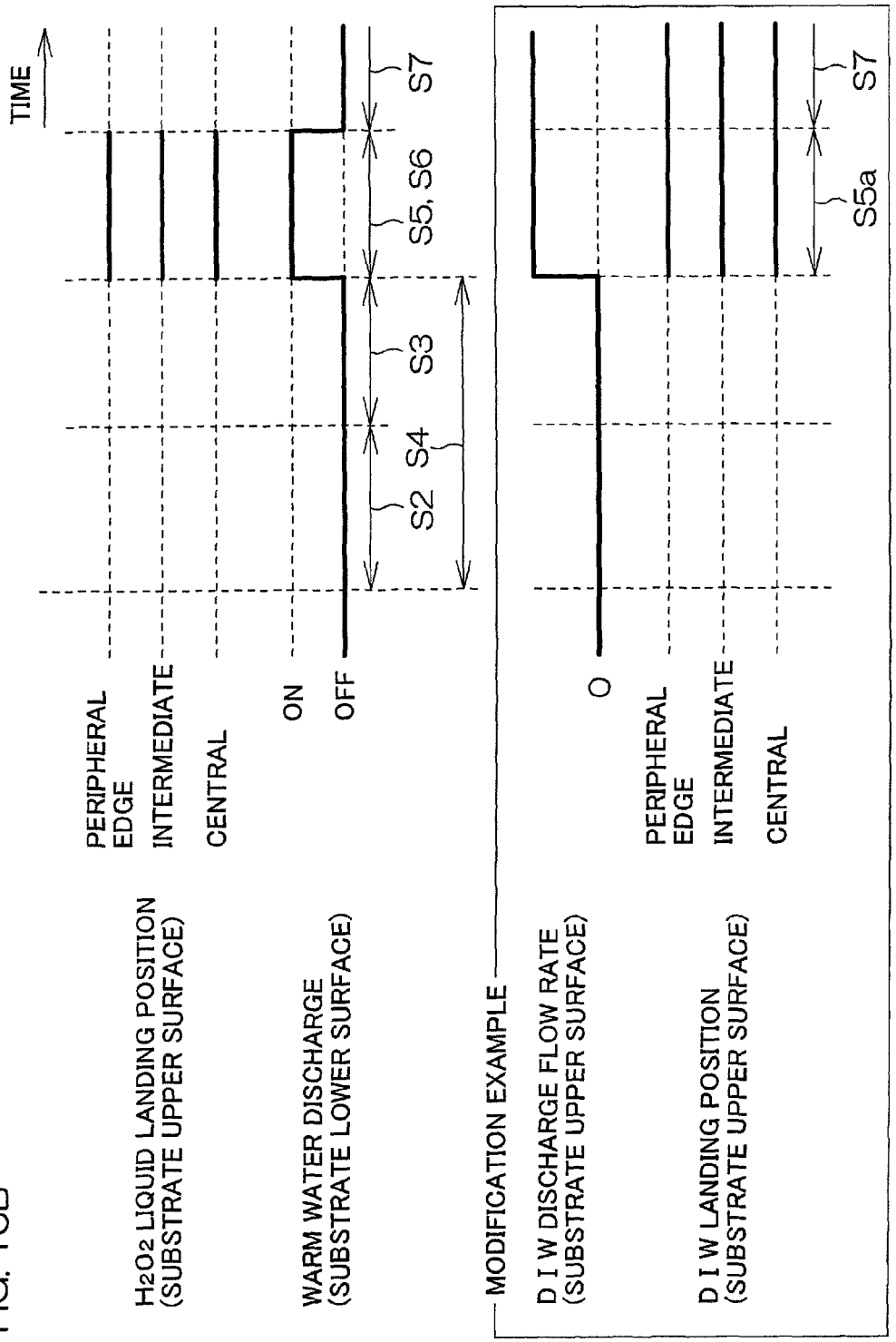

SUBSTRATE PROCESSING METHOD AND SUBSTRATE PROCESSING APPARATUS

BACKGROUND OF THE INVENTION

1. Field of the Invention

The present invention relates to a substrate processing apparatus and a substrate processing method for processing a substrate. Examples of substrates to be processed include semiconductor wafers, substrates for liquid crystal displays, substrates for plasma displays, substrates for FEDs (field emission displays), substrates for optical disks, substrates for magnetic disks, substrates for magneto-optical disks, substrates for photomasks, ceramic substrates, substrates for solar cells, etc.

2. Description of Related Art

In a manufacturing process for a semiconductor device or a liquid crystal display device, etc., processing liquids having different temperatures may be supplied successively to a substrate while rotating the substrate by a spin chuck. For example, Japanese Patent Application Publication No. 2009-238862 discloses that after supplying SPM (sulfuric acid-hydrogen peroxide mixture) having high temperature to an upper surface of a rotating substrate, DIW (deionized water) having ordinary temperature is supplied to the upper surface of the substrate that is covered with the SPM to rinse off the SPM attached to the upper surface of the substrate.

When a high-temperature SPM or other high-temperature processing liquid is supplied to a substrate, the substrate itself becomes high in temperature. When in the state where the substrate is covered with the high-temperature processing liquid, the supplying of an ordinary temperature DIW or other low-temperature processing liquid is started, the temperature of the substrate decreases suddenly and rapidly at a liquid landing position of the low-temperature processing liquid and at positions in a vicinity of the liquid landing position (hereinafter referred to as a "liquid landing position vicinity region"). Stress that contracts the substrate thus arises in the liquid landing position vicinity region and the substrate deforms so as to be warped or undulated due to a temperature difference between the liquid landing position vicinity region and another region that is in a high-temperature state. Although when the low-temperature processing liquid spreads sufficiently across the substrate, the temperature differences between respective portions of the substrate decrease and such deformation is resolved, the state in which the substrate is deformed is sustained until then.

With a clamping type spin chuck, a plurality of chuck pins are pressed against a peripheral edge portion of a substrate. When the substrate deforms in the state where the plurality of chuck pins are pressed against the peripheral edge portion of the substrate, the pressing pressures applied to the substrate by the respective chuck pins change and the stability of substrate holding by the spin chuck may decrease. Also, with a vacuum type spin chuck, a lower surface of a substrate is suctioned onto an upper surface of a spin base (suction base). When the substrate deforms in the state where the lower surface of the substrate is suctioned onto the upper surface of the spin base, the closely contacting state of the lower surface of the substrate and the upper surface of the spin base changes and the stability of substrate holding by the spin chuck may decrease.

In the abovementioned publication, it is disclosed that the SPM having high temperature (for example, 150° C.) and DIW having ordinary temperature (for example, 25° C.) are supplied to the substrate. The supplying of the DIW as the low-temperature processing liquid may thus be started in a state where there is a temperature difference of not less than 100° C. between the substrate and the DIW. The present inventors have confirmed that the deformation of the substrate can occur not only when the temperature difference between the substrate and the low-temperature processing liquid is not less than 100° C. but can also occur when the temperature difference is less than 100° C. (for example, at 60° C.). The deformation of the substrate can thus occur not only when the high-temperature SPM and the ordinary-temperature DIW are supplied successively but can also occur when other processing liquids with temperature difference are supplied successively to the substrate.

SUMMARY OF THE INVENTION

An object of the present invention is to suppress localized temperature change of a substrate at the start of supplying of a processing liquid.

A preferred embodiment of the present invention provides a substrate processing method including a chemical liquid supplying step of supplying a chemical liquid having a first temperature to a major surface of a substrate, a rinse liquid supplying step of supplying, after the chemical liquid supplying step, a rinse liquid having a second temperature lower than the first temperature to the major surface of the substrate to rinse off the liquid remaining on the substrate, a reaction liquid supplying step of supplying, after the chemical liquid supplying step and before the rinse liquid supplying step, a reaction liquid, causing an exothermic reaction upon mixing with the chemical liquid and having a liquid temperature lower than the first temperature and not less than the second temperature, to the major surface of the substrate in a state where the chemical liquid supplied to the substrate in the chemical liquid supplying step remains on the substrate, and a temperature decrease suppressing step of supplying, in parallel to the reaction liquid supplying step, a heating fluid having lower temperature than the first temperature and higher temperature than the liquid temperature of the reaction liquid to another major surface of the substrate at the opposite side of the major surface of the substrate to which the chemical liquid is supplied in the chemical liquid supplying step. The major surface of the substrate may be a front surface on which a device is formed or may be a rear surface at the opposite side of the front surface.

With this method, the chemical liquid having the first temperature (the temperature of the chemical liquid before being supplied to the substrate) is supplied to the major surface of the substrate. The reaction liquid is then supplied to the major surface of the substrate in the state where the chemical liquid remains on the substrate. The reaction liquid supplied to the substrate mixes with the chemical liquid remaining on the substrate. The proportion of the reaction liquid in the liquid remaining on the substrate (the liquid containing the chemical liquid and the reaction liquid) thus increases and the concentration of the chemical liquid decreases. The rinse liquid having the second temperature (the temperature of the rinse liquid before being supplied to the substrate) lower than the first temperature is supplied to the major surface of the substrate after the reaction liquid has been supplied to the substrate. The liquid remaining on the substrate is thereby rinsed off.

When the supplying of the reaction liquid is started, the temperature of the substrate approaches the temperature of the reaction liquid. The temperature of the reaction liquid before being supplied to the substrate is lower than the temperature (first temperature) of the chemical liquid and not less than the temperature (second temperature) of the rinse liquid.

Upon mixing with the chemical liquid, the reaction liquid causes an exothermic reaction in the chemical liquid. Therefore, when the reaction liquid is supplied to the major surface of the substrate in the state where the chemical liquid remains on the substrate, the exothermic reaction occurs at the liquid landing position of the reaction liquid and at positions in the vicinity of the liquid landing position so that the temperature decrease amount of the substrate is reduced in the liquid landing position vicinity region. The temperature of the substrate thus approaches the temperature of the reaction liquid gradually. Sudden and rapid temperature decrease of the substrate can thus be suppressed to reduce the amount of deformation of the substrate in comparison to a case where the rinse liquid having the second temperature lower than the first temperature is supplied to the substrate in succession to the supplying of the chemical liquid.

Further, in parallel to the supplying of the reaction liquid to the major surface of the substrate, the high-temperature heating fluid is supplied to the other major surface of the substrate. The temperature of the heating fluid before being supplied to the substrate is lower than the temperature (first temperature) of the chemical liquid and higher than the temperature of the reaction liquid before being supplied to the substrate. Localized temperature decrease of the substrate due to the supplying of the reaction liquid is thus suppressed by the heating fluid being supplied to the substrate in parallel to the supplying of the reaction liquid. Further, the temperature decrease of the substrate can be suppressed without hindering the reaction of the chemical liquid and the substrate because the heating fluid is supplied to the other major surface of the substrate at the opposite side of the surface to which the chemical liquid and the reaction liquid are supplied.

The heating fluid may be a liquid (heating liquid) or may be a gas (heating gas). An example of a heating liquid is water. Examples of a heating gas include inert gases and water vapor. The heating fluid may be supplied to the entirety of the other major surface or may be supplied to a portion of the other major surface. For example, the heating fluid may be discharged toward the other major surface of the substrate so that the liquid landing position of the reaction liquid with respect to the major surface of the substrate and the landing position of the heating fluid with respect to the other major surface of the substrate are positions at opposite sides with respect to the substrate.

In the preferred embodiment of the present invention, the temperature decrease suppressing step may be started after the discharge of the chemical liquid onto the substrate in the chemical liquid supplying step is stopped.

With this method, the supplying of the heating fluid to the substrate is started after the discharge of the chemical liquid onto the substrate is stopped. When the chemical liquid is being discharged toward the substrate, the chemical liquid supplied before is discharged outward form the substrate. Therefore, when the heating fluid is discharged toward the substrate in parallel to the discharge of the chemical liquid, a large amount of the chemical liquid may be mixed with the heating fluid at positions around the substrate. On the other hand, when the discharge of the chemical liquid is stopped, the chemical liquid expelled from the substrate is small or zero in amount and therefore a large amount of the chemical liquid will not be mixed with the heating fluid at positions around the substrate. Therefore, even in a case where the chemical liquid generates heat due to mixing with the heating fluid (for example, in a case where the chemical liquid is a liquid that contains sulfuric acid and the heating fluid is a gas or liquid that contains water), the chemical liquid expelled from the substrate can be prevented from rising significantly in temperature. Temperature rise of a cup or other cylindrical capturing member that captures the liquid expelled from the substrate can thus be suppressed.

In the preferred embodiment of the present invention, the reaction liquid supplying step may include a step of moving the liquid landing position of the reaction liquid with respect to the major surface of the substrate. The temperature decrease suppressing step may include a step of moving the landing position of the heating fluid with respect to the other major surface of the substrate such that a difference between the distance from a center of the substrate to the liquid landing position of the reaction liquid and the distance from the center of the substrate to the landing position of the heating fluid is reduced. The distance from the center of the substrate to the liquid landing position of the reaction liquid signifies a rectilinear distance from the center of the substrate to the liquid landing position of the reaction liquid in a direction parallel to the major surface of the substrate. Similarly, the distance from the center of the substrate to the landing position of the heating fluid signifies a rectilinear distance from the center of the substrate to the landing position of the heating fluid in a direction parallel to the major surface of the substrate.

With this method, in parallel to the moving of the liquid landing position of the reaction liquid with respect to the major surface of the substrate, the landing position of the heating fluid with respect to the other major surface of the substrate is moved so that the difference between the distance from the center of the substrate to the liquid landing position of the reaction liquid and the distance from the center of the substrate to the landing position of the heating fluid is reduced. The heating fluid is thereby blown onto a position close to the liquid landing position of the reaction liquid. The heat of the heating fluid is thus transmitted to the substrate from the position close to the liquid landing position of the reaction liquid and the temperature decrease amount at the liquid landing position of the reaction liquid and positions in the vicinity thereof is reduced further. Deformation of the substrate due to temperature difference can thereby be suppressed or prevented.

In the preferred embodiment of the present invention, the temperature decrease suppressing step may include a step of moving the landing position of the heating fluid with respect to the other major surface of the substrate such that the landing position of the heating fluid with respect to the other major surface of the substrate and the liquid landing position of the reaction liquid with respect to the major surface of the substrate opposes each other via the substrate, when the liquid landing position of the reaction liquid with respect to the major surface of the substrate is moved.

With this method, the heating fluid is blown onto the position at the opposite side of the liquid landing position of the reaction liquid. That is, the liquid landing position of the reaction liquid and the landing position of the heating fluid are aligned in a direction perpendicular to the major surface of the substrate via the substrate. Further, when the liquid landing position of the reaction liquid is moved within the major surface of the substrate, the landing position of the heating fluid is also moved within the other major surface of the substrate. The landing position of the heating fluid is thus always positioned at the opposite side of the liquid landing position of the reaction liquid. The heating fluid is a fluid having higher temperature than the reaction liquid. The heat of the heating fluid is thus transmitted to the substrate from the position at the opposite side of the liquid landing position of the reaction liquid. The temperature decrease amount at the liquid landing position of the reaction liquid and positions in the vicinity thereof is reduced further. Deformation of the substrate due to temperature difference can thereby be suppressed or prevented.

The substrate processing method may further include a heating step of heating, before the reaction liquid supplying step, the substrate and the chemical liquid at a heating temperature higher than the first temperature in the state in which the chemical liquid supplied to the substrate in the chemical liquid supplying step remains on the substrate. In this case, the heating step may include an infrared heating step of heating the substrate and the chemical liquid at the heating temperature by an infrared heater facing the major surface of the substrate.

With this method, the temperatures of the substrate and the chemical liquid rise to the heating temperature higher than the temperature (first temperature) of the chemical liquid before being supplied to the substrate, and the temperature difference between the substrate before the supplying of the reaction liquid and the rinse liquid is increased further. However, the reaction liquid is supplied to the substrate before supplying the rinse liquid. The arising of a large temperature difference within the substrate due to localized decrease of the substrate temperature when the rinse liquid is supplied to the substrate can thus be suppressed or prevented. The amount of deformation of the substrate can thereby be reduced.

Another preferred embodiment of the present invention provides a substrate processing apparatus including a substrate holding unit holding and rotating a substrate, a chemical liquid supplying unit discharging a chemical liquid having a first temperature toward a major surface of the substrate held by the substrate holding unit, a rinse liquid supplying unit discharging a rinse liquid having a second temperature lower than the first temperature toward the major surface of the substrate held by the substrate holding unit, a reaction liquid supplying unit discharging a reaction liquid, having a liquid temperature lower than the first temperature and not less than the second temperature and causing an exothermic reaction upon mixing with the chemical liquid, toward the major surface of the substrate held by the substrate holding unit, a heating fluid supplying unit discharging a heating fluid having a temperature lower than the first temperature and higher than the liquid temperature of the reaction liquid toward another major surface of the substrate at the opposite side of the major surface of the substrate held by the substrate holding unit, and a controller controlling the substrate holding unit, the chemical liquid supplying unit, the rinse liquid supplying unit, the reaction liquid supplying unit, and the heating fluid supplying unit.

The controller executes a chemical liquid supplying step of supplying the chemical liquid having the first temperature to the major surface of the substrate, a rinse liquid supplying step of supplying, after the chemical liquid supplying step, the rinse liquid having the second temperature to the major surface of the substrate to rinse off the liquid remaining on the substrate, a reaction liquid supplying step of supplying, after the chemical liquid supplying step and before the rinse liquid supplying step, the reaction liquid having the liquid temperature lower than the first temperature and not less than the second temperature to the major surface of the substrate in a state where the chemical liquid supplied to the substrate in the chemical liquid supplying step remains on the substrate, and a temperature decrease suppressing step of supplying, in parallel to the reaction liquid supplying step, the heating fluid to the other major surface of the substrate. With this arrangement, the respective steps of the substrate processing method described above are executed by the controller controlling the substrate processing apparatus. The same effects as the effects described above can thus be exhibited.

The aforementioned and other objects, features, and effects of the present invention shall be clarified by the following description of preferred embodiments with reference to the accompanying drawings.

BRIEF DESCRIPTION OF THE DRAWINGS

FIG. 5 is a time chart in outline of a first processing example performed by a processing unit.

FIGS. 6A and 6B are a specific time chart of a portion of the first processing example.

FIGS. 7A and 7B are a specific time chart of a portion of a second processing example performed by the processing unit.

FIGS. 16A and 16B are a specific time chart of a portion of a sixth processing example performed by the processing unit.

DETAILED DESCRIPTION OF THE PREFERRED EMBODIMENTS

Figure 1:
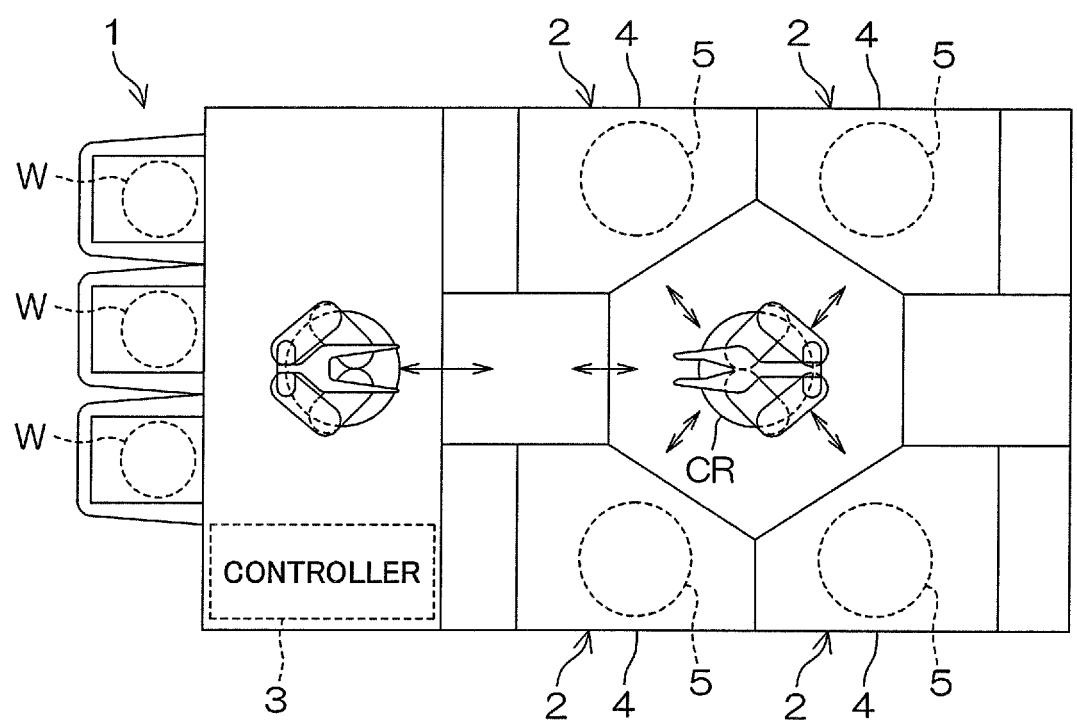
FIG. 1 is a schematic plan view of a substrate processing apparatus according to a first preferred embodiment of the present invention.
Figure 2:
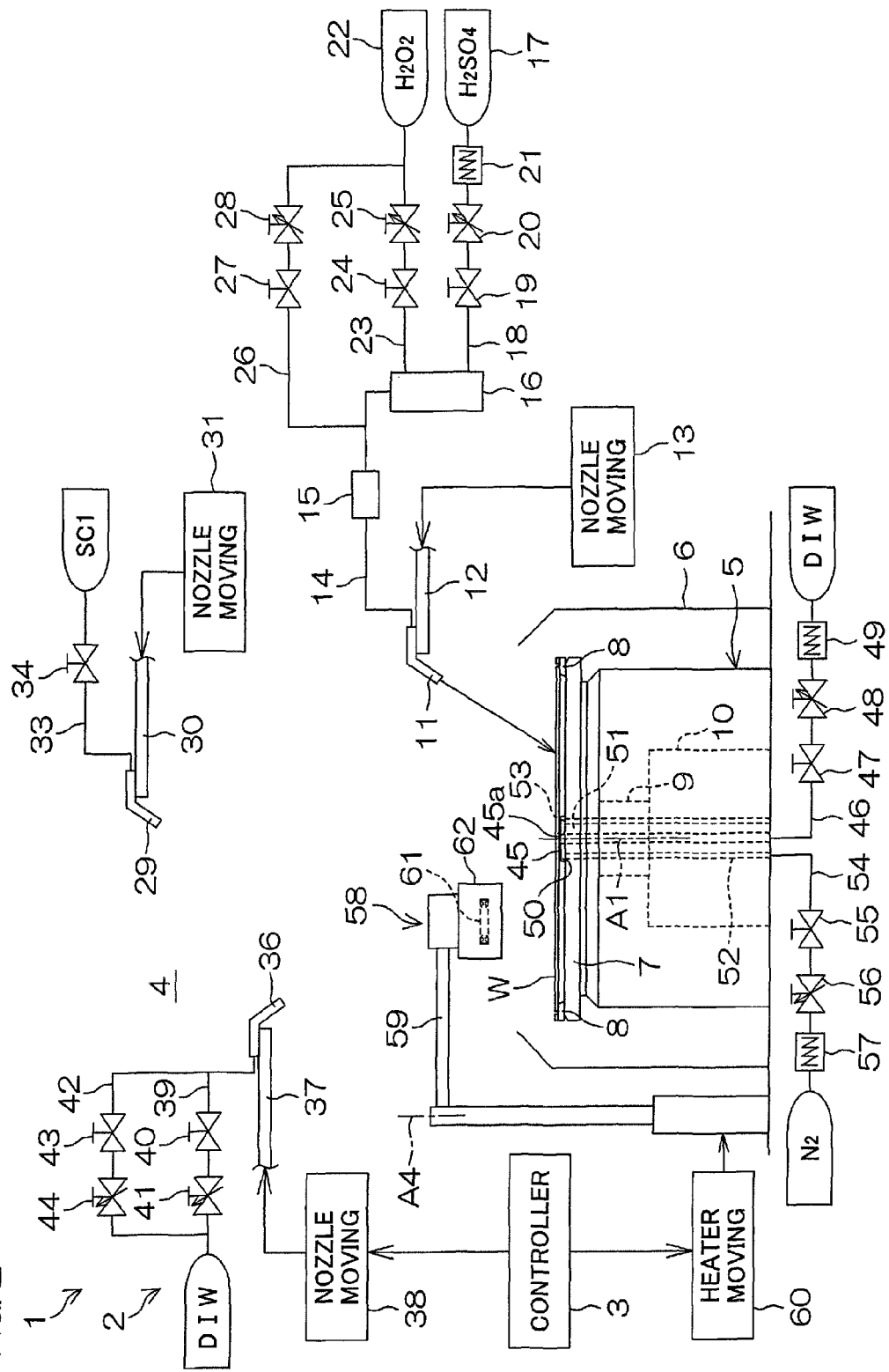
FIG. 2 is a horizontally-viewed schematic view of the interior of a chamber included in the substrate processing apparatus according to the first preferred embodiment of the present invention.
Figure 3:
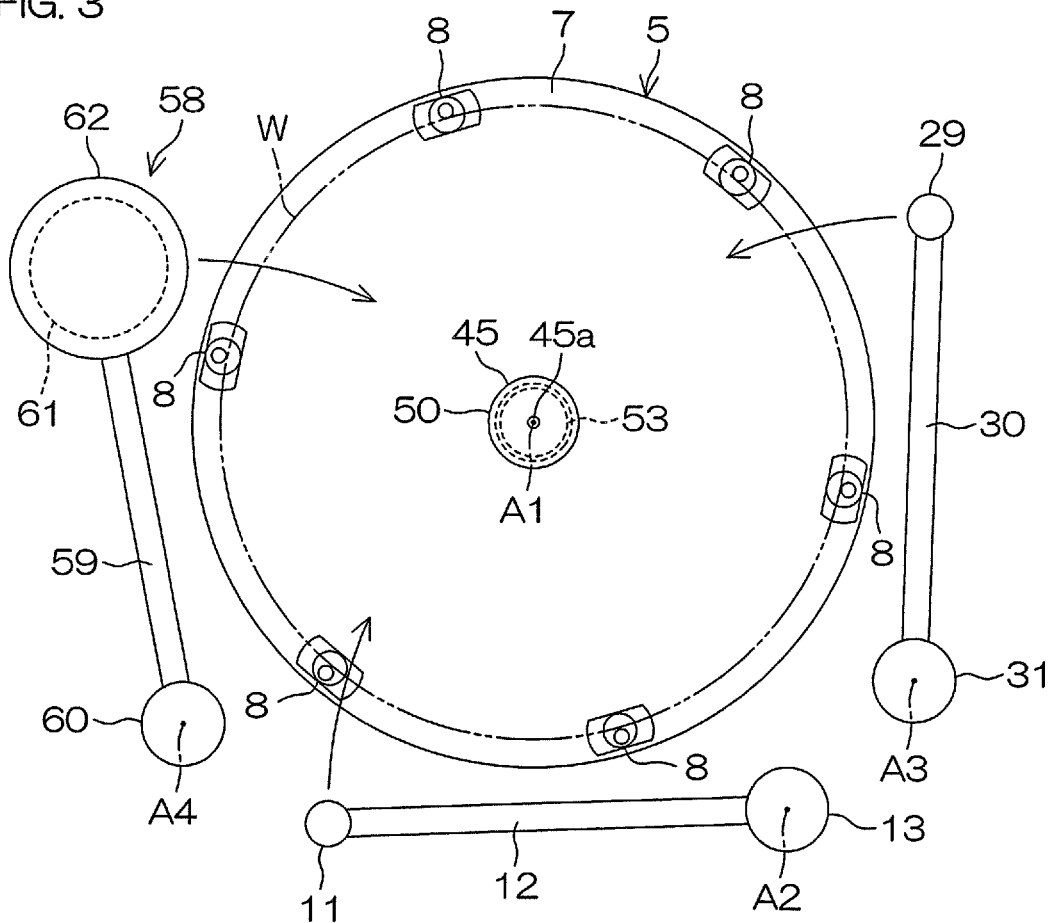
FIG. 3 is a schematic plan view of a spin base and an arrangement related thereto.
Figure 4:
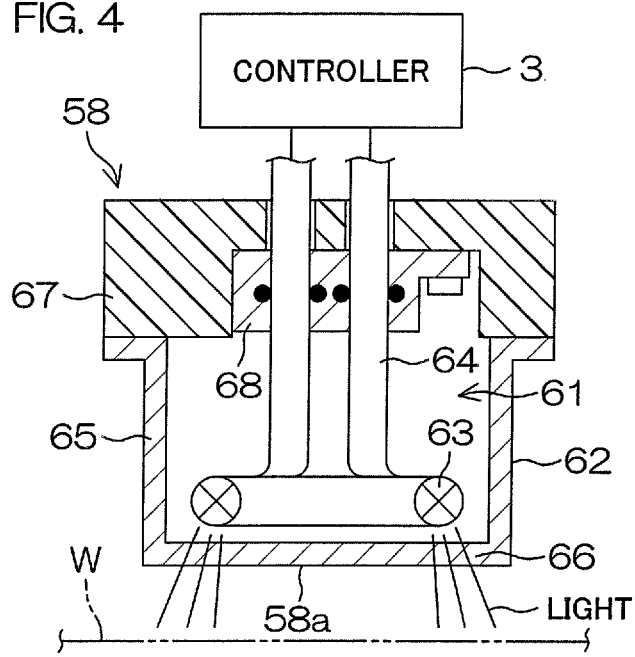
FIG. 4 is a vertical sectional view of an infrared heater.

FIG. 1 is a schematic plan view of a substrate processing apparatus 1 according to a first preferred embodiment of the present invention. FIG. 2 is a horizontally-viewed schematic view of the interior of a chamber 4 included in the substrate processing apparatus 1 according to the first preferred embodiment of the present invention. FIG. 3 is a schematic plan view of a spin base 7 and an arrangement related thereto. FIG. 4 is a vertical sectional view of an infrared heater 58.

As shown in FIG. 1, the substrate processing apparatus 1 is a single substrate processing type apparatus that processes a disk-shaped substrate W, such as a semiconductor wafer, etc., one by one. The substrate processing apparatus 1 includes a plurality of processing units 2, each processing a substrate W using processing liquids and processing gases, a substrate transfer robot CR performing carrying-in and carrying-out of a substrate W with respect to the chamber 4 of each processing unit 2, and a controller 3 controlling operations of devices and opening and closing of valves provided in the substrate processing apparatus 1.

As shown in FIG. 2, each processing unit 2 is a single substrate processing type unit. Each processing unit 2 includes the box-shaped chamber 4 that has an internal space, a spin chuck 5 holding a single substrate W in a horizontal attitude inside the chamber 4 and rotating the substrate W around a vertical substrate rotation axis A1 passing through the center of the substrate W, a processing liquid supplying device supplying a processing liquid, such as a chemical liquid, a rinse liquid, etc., to the substrate W held by the spin chuck 5, a heating device heating the substrate W, held by the spin chuck 5, from above the substrate W, and a cylindrical cup 6 surrounding a periphery of the spin chuck 5 around the substrate rotation axis A1.

As shown in FIG. 2, the spin chuck 5, corresponding to being a substrate holding unit, includes a disk-shaped spin base 7 that is held in a horizontal attitude, a plurality of chuck pins 8 projecting upward from upper surface outer peripheral portions of the spin base 7, and a chuck opening/closing mechanism (not shown) that opens and closes the plurality of chuck pins 8. The spin chuck 5 further includes a spin shaft 9 extending downward along the substrate rotation axis A1 from a central portion of the spin base 7, and a spin motor 10 rotating the spin shaft 9 to rotate the spin base 7 and the chuck pins 8 around the substrate rotation axis A1.

As shown in FIG. 2, the outer diameter of the spin base 7 is greater than the diameter of the substrate W. The center line of the spin base 7 is disposed along the substrate rotation axis A1. The plurality of chuck pins 8 are held by the spin base 7 at the outer peripheral portions of the spin base 7. The plurality of chuck pins 8 are spaced apart by intervals in the circumferential direction (direction around the substrate rotation axis A1). Each chuck pin 8 is each capable of rotating around a vertical pin rotation axis with respect to the spin base 7 between a closed position at which the chuck pin 8 is pressed against a peripheral end surface of the substrate W and an open position at which the chuck pin 8 is separated from the peripheral end surface of the substrate W. The chuck opening/closing mechanism makes the chuck pins 8 rotate around the pin rotation axes.

The controller 3 controls the chuck opening/closing mechanism to switch the state of the plurality of chuck pins 8 between the closed state in which the plurality of chuck pins 8 hold the substrate W and the open state in which the holding of the substrate W by the plurality of chuck pins 8 is released. When the substrate W is transferred to the spin chuck 5, the controller 3 makes the respective chuck pins 8 retract to the open positions. In this state, the controller 3 makes the substrate transfer robot CR operate to place the substrate W on the plurality of chuck pins 8. Thereafter, the controller 3 makes the respective chuck pins 8 move to the closed positions. The substrate W is thereby held by the plurality of chuck pins 8 in a state where a lower surface of the substrate W and an upper surface of the spin base 7 are separated in an up/down direction. When the controller 3 makes the spin motor 10 rotate in this state, the substrate W rotates around the substrate rotation axis A1 together with the spin base 7 and the chuck pins 8.

As shown in FIG. 2, each processing unit 2 includes a first chemical liquid nozzle 11 that discharges a chemical liquid, such as SPM (a mixed liquid containing $H_2SO_4$ and $H_2O_2$) etc., toward an upper surface of the substrate W, a first nozzle arm 12 having a tip portion on which the first chemical liquid nozzle 11 mounted, and a first nozzle moving device 13 that moves the first nozzle arm 12 to move the first chemical liquid nozzle 11.

As shown in FIG. 2, the first chemical liquid nozzle 11, which serves in common as a reaction liquid nozzle, is held in an inwardly facing attitude by the first nozzle arm 12. The inwardly facing attitude is an attitude in which a processing liquid is discharged in a discharge direction that is inclined with respect to the upper surface of the substrate W so that the processing liquid lands at a position further inward (toward the substrate rotation axis A1 side) than a processing liquid discharge port. The first chemical liquid nozzle 11 is not restricted to being held in the inwardly facing attitude and may instead be held by the first nozzle arm 12 in a perpendicular attitude in which the processing liquid is discharged in a direction perpendicular to the upper surface of the substrate W or may be held by the first nozzle arm 12 in an outwardly facing attitude in which the processing liquid is discharged in a discharge direction that is inclined with respect to the upper surface of the substrate W so that the processing liquid lands at a position further outward (toward the side opposite to the substrate rotation axis A1 side) than the processing liquid discharge port.

As shown in FIG. 3, the first nozzle moving device 13 rotates the first nozzle arm 12 around a first nozzle rotation axis A2 extending in a vertical direction at a periphery of the spin chuck 5 to make the first chemical liquid nozzle 11 move horizontally along a path passing through an upper surface central portion of the substrate W in a plan view. The first nozzle moving device 13 makes the first chemical liquid nozzle 11 move horizontally between a processing position at which the chemical liquid discharged from the first chemical liquid nozzle 11 lands on the upper surface of the substrate W and a retracted position at which the first chemical liquid nozzle 11 is retracted to the periphery of the spin chuck 5 in a plan view (position shown in FIG. 3). Further, the first nozzle moving device 13 makes the first chemical liquid nozzle 11 move horizontally among a central position at which the chemical liquid discharged from the first chemical liquid nozzle 11 lands at the upper surface central portion of the substrate W, an intermediate position at which the chemical liquid discharged from the first chemical liquid nozzle 11 lands at an upper surface intermediate portion of the substrate W, and a peripheral edge position at which the chemical liquid discharged from the first chemical liquid nozzle 11 lands at an upper surface peripheral edge portion of the substrate W. The central position, the intermediate position, and the peripheral edge positions are all processing positions.

The upper surface central portion of the substrate W is a circular region that includes the center of the upper surface, and the upper surface peripheral edge portion of the substrate W is an annular region that includes the outer edge of the upper surface. The upper surface intermediate portion of the substrate W is an annular region between the outer edge of the upper surface central portion and the inner edge of the upper surface peripheral edge portion. The widths of the upper surface central portion, the upper surface intermediate portion, and the upper surface peripheral edge portion are, for example, as follows. Width of the central portion (distance in the radial direction from the center of the substrate W to the outer edge of the central portion): 5/15 of the radius of the substrate W. Width of the intermediate portion (distance in the radial direction from the inner edge of the intermediate portion to the outer edge of the intermediate portion): 9/15 of the radius of the substrate W. Width of the peripheral edge portion (distance in the radial direction from the inner edge of the peripheral edge portion to the outer edge of the peripheral edge portion): 1/15 of the radius of the substrate W. These proportions are an example and do not restrict the application of other proportions.

As shown in FIG. 2, each processing unit 2 includes a first chemical liquid piping 14 that guides the SPM or other chemical liquid to the first chemical liquid nozzle 11, a stirring piping 15 that stirs the sulfuric acid and the hydrogen peroxide water inside the first chemical liquid piping 14, and a mixing valve 16 that mixes the sulfuric acid and the hydrogen peroxide water supplied to the first chemical liquid piping 14 at an upstream side of the stirring piping 15.

As shown in FIG. 2, each processing unit 2 includes a sulfuric acid tank 17 containing sulfuric acid (liquid), which is an example of a heat generating chemical liquid, a first heater 21 heating the sulfuric acid to maintain the sulfuric acid inside the sulfuric acid tank 17 at a temperature (a fixed temperature in a range of 60 to 90° C., for example, 80° C.) higher than room temperature, a sulfuric acid piping 18 guiding the sulfuric acid inside the sulfuric acid tank 17 to the mixing valve 16, a sulfuric acid valve 19 opening and closing the interior of the sulfuric acid piping 18, and a sulfuric acid flow control valve 20 increasing and decreasing the flow rate of the sulfuric acid supplied from the sulfuric acid piping 18 to the mixing valve 16. Although not illustrated, the sulfuric acid flow control valve 20 includes a valve body having a valve seat provided in the interior, a valve element opening and closing the valve seat, and an actuator that moves the valve element between an open position and a closed position. The same applies to other flow control valves.

As shown in FIG. 2, each processing unit 2 includes a hydrogen peroxide water tank 22 containing hydrogen peroxide water, which is an example of a reaction chemical liquid, a first hydrogen peroxide water piping 23 guiding the hydrogen peroxide water having room temperature (within a range of 20° C. to 30° C., for example, 25° C.) inside the hydrogen peroxide water tank 22 to the mixing valve 16, a first hydrogen peroxide water valve 24 opening and closing the interior of the first hydrogen peroxide water piping 23, and a first hydrogen peroxide water flow control valve 25 increasing and decreasing the flow rate of the hydrogen peroxide water supplied from the first hydrogen peroxide water piping 23 to the mixing valve 16.

As shown in FIG. 2, each processing unit 2 further includes a second hydrogen peroxide water piping 26 guiding the hydrogen peroxide water inside the hydrogen peroxide water tank 22 into the first chemical liquid piping 14, a second hydrogen peroxide water valve 27 opening and closing the interior of the second hydrogen peroxide water piping 26, and a second hydrogen peroxide water flow control valve 28 increasing and decreasing the flow rate of the hydrogen peroxide water supplied from the second hydrogen peroxide water piping 26 to the first chemical liquid piping 14. An upstream end of the second hydrogen peroxide water piping 26 is connected to the first hydrogen peroxide water piping 23 at a position further upstream than the first hydrogen peroxide water valve 24 and the first hydrogen peroxide water flow control valve 25, and a downstream end of the second hydrogen peroxide water piping 26 is connected to the first chemical liquid piping 14 at a position further upstream than the mixing piping 15.

When the sulfuric acid valve 19 is opened, the high-temperature sulfuric acid is supplied from the sulfuric acid piping 18 to the mixing valve 16 at a flow rate corresponding to the opening degree of the sulfuric acid flow control valve 20. Also, when the first hydrogen peroxide water valve 24 is opened, the room-temperature hydrogen peroxide water inside the hydrogen peroxide water tank 22 is supplied from the first hydrogen peroxide water piping 23 to the mixing valve 16 at a flow rate corresponding to the opening degree of the first hydrogen peroxide water flow control valve 25. The sulfuric acid and the hydrogen peroxide water are thereby supplied to the mixing valve 16 at predetermined proportions (if "X1" is the proportion of sulfuric acid and "Y1" is the proportion of hydrogen peroxide water, for example, X1>Y1).

The sulfuric acid and the hydrogen peroxide water supplied to the mixing valve 16 are supplied from the first chemical liquid piping 14 to the first chemical liquid nozzle 11 via the mixing piping 15. In this process, the sulfuric acid and the hydrogen peroxide water are mixed at the mixing valve 16 and stirred at the stirring piping 15. The sulfuric acid and the hydrogen peroxide water are thereby mixed uniformly, and the mixed liquid (SPM) of the sulfuric acid and the hydrogen peroxide water is heated by the reaction of the sulfuric acid and the hydrogen peroxide water to a first temperature (of not less than 100° C., for example, 160° C.) higher than the temperatures of the sulfuric acid and the hydrogen peroxide water before mixing. The SPM having high temperature (the first temperature) that is formed by the mixing of the sulfuric acid and the hydrogen peroxide water is thus discharged from the first chemical liquid nozzle 11. SPM is a mixed chemical liquid that contains peroxymonosulfuric acid, which has a high oxidizing power.

Also, when the sulfuric acid valve 19 and the first hydrogen peroxide water valve 24 are closed and the second hydrogen peroxide water valve 27 is opened, the room-temperature hydrogen peroxide water inside the hydrogen peroxide water tank 22 bypasses the mixing valve 16 and flows into the first chemical liquid piping 14 from the second hydrogen peroxide water piping 26. The room-temperature hydrogen peroxide water is thereby supplied from the second hydrogen peroxide water piping 26 to the first chemical liquid piping 14 at a flow rate corresponding to the opening degree of the second hydrogen peroxide water flow control valve 28. The room-temperature hydrogen peroxide water supplied to the first chemical liquid piping 14 is discharged from the first chemical liquid nozzle 11.

As shown in FIG. 2, each processing unit 2 includes a second chemical liquid nozzle 29 that discharges a chemical liquid, such as SC1 (a mixed liquid containing $NH_4OH$ and $H_2O_2$), etc., toward the upper surface of the substrate W, a second nozzle arm 30 having a tip portion on which the second chemical liquid nozzle 29 mounted, and a second nozzle moving device 31 that moves the second nozzle arm 30 to move the second chemical liquid nozzle 29. FIG. 2 shows an example where the second chemical liquid nozzle 29 is held in an inwardly facing attitude by the second nozzle arm 30. The second chemical liquid nozzle 29 is not restricted to being held in the inwardly facing attitude and may instead be held by the second nozzle arm 30 in a perpendicular attitude or in an outwardly facing attitude.

As shown in FIG. 3, the second nozzle moving device 31 rotates the second nozzle arm 30 around a second nozzle rotation axis A3 extending in the vertical direction at a periphery of the spin chuck 5 to make the second chemical liquid nozzle 29 move horizontally along a path passing through an upper surface central portion of the substrate W in a plan view. The second nozzle moving device 31 makes the second chemical liquid nozzle 29 move horizontally between a processing position at which the chemical liquid discharged from the second chemical liquid nozzle 29 lands on the upper surface of the substrate W and a retracted position at which the second chemical liquid nozzle 29 is retracted to the periphery of the spin chuck 5 in a plan view. Further, the second nozzle moving device 31 makes the second chemical liquid nozzle 29 move horizontally among a central position, an intermediate position, and a peripheral edge position.

As shown in FIG. 2, each processing unit 2 includes a second chemical liquid piping 33 that guides the SC1, having a temperature (for example, 30 to 50° C.) lower than the temperature of the SPM (first temperature) and higher than room temperature, to the second chemical liquid nozzle 29 and a second chemical liquid valve 34 opening and closing the interior of the second chemical liquid piping 33. When the second chemical liquid valve 34 is opened, the SC1 from a second chemical liquid supply source is supplied from the second chemical liquid piping 33 to the second chemical liquid nozzle 29. The SC1 (liquid) of, for example, 40° C. is thereby discharged from the second chemical liquid nozzle 29.

As shown in FIG. 2, each processing unit 2 includes a rinse liquid nozzle 36 discharging a rinse liquid toward the upper surface of the substrate W, a third nozzle arm 37 having a tip portion on which the rinse liquid nozzle 36 mounted, and a third nozzle moving device 38 that moves the third nozzle arm 37 to move the rinse liquid nozzle 36. FIG. 2 shows an example where the rinse liquid nozzle 36 is held in an inwardly facing attitude by the third nozzle arm 37. The rinse liquid nozzle 36 is not restricted to being held in the inwardly facing attitude and may instead be held by the third nozzle arm 37 in a perpendicular attitude or in an outwardly facing attitude.

Although not illustrated, the third nozzle moving device 38 rotates the third nozzle arm 37 around a third nozzle rotation axis extending in the vertical direction at a periphery of the spin chuck 5 to make the rinse liquid nozzle 36 move horizontally along a path passing through an upper surface central portion of the substrate W in a plan view. The third nozzle moving device 38 makes the rinse liquid nozzle 36 move horizontally between a processing position at which the rinse liquid discharged from the rinse liquid nozzle 36 lands on the upper surface of the substrate W and a retracted position at which the rinse liquid nozzle 36 is retracted to the periphery of the spin chuck 5 in a plan view. Further, the third nozzle moving device 38 makes the rinse liquid nozzle 36 move horizontally among a central position, an intermediate position, and a peripheral edge position.

As shown in FIG. 2, each processing unit 2 includes a first rinse liquid piping 39 that guides the rinse liquid from a rinse liquid supply source to the rinse liquid nozzle 36, a first rinse liquid valve 40 opening and closing the interior of the first rinse liquid piping 39, and a first rinse liquid flow control valve 41 increasing and decreasing the flow rate of the rinse liquid supplied from the first rinse liquid piping 39 to the rinse liquid nozzle 36. Each processing unit 2 further includes a second rinse liquid piping 42 that guides the rinse liquid from the rinse liquid supply source to the rinse liquid nozzle 36, a second rinse liquid valve 43 opening and closing the interior of the second rinse liquid piping 42, and a second rinse liquid flow control valve 44 increasing and decreasing the flow rate of the rinse liquid supplied from the second rinse liquid piping 42 to the rinse liquid nozzle 36.

When the first rinse liquid valve 40 is opened, the rinse liquid having room temperature (for example, 25° C.) is discharged from the rinse liquid nozzle 36 at a flow rate corresponding to the opening degree of the first rinse liquid flow control valve 41. Similarly, when the second rinse liquid valve 43 is opened, the rinse liquid having room temperature (for example, 25° C.) is discharged from the rinse liquid nozzle 36 at a flow rate corresponding to the opening degree of the second rinse liquid flow control valve 44. The rinse liquid discharged from the rinse liquid nozzle 36 is pure water (deionized water). The rinse liquid supplied to the rinse liquid nozzle 36 is not restricted to pure water and may instead be carbonated water, electrolyzed ion water, hydrogen water, ozone water, IPA (isopropyl alcohol), or aqueous hydrochloric acid solution of dilute concentration (for example, approximately 10 to 100 ppm), etc.

The opening degree of the first rinse liquid flow control valve 41 may be greater or smaller than the opening degree of the second rinse liquid flow control valve 44 or may be equal to the opening degree of the second rinse liquid flow control valve 44. When the opening degrees of the first rinse liquid flow control valve 41 and the second rinse liquid flow control valve 44 differ, the flow rate of the rinse liquid discharged from the rinse liquid nozzle 36 can be changed by switching between the first rinse liquid valve 40 and the second rinse liquid valve 43 and without changing the opening degrees of the first rinse liquid flow control valve 41 and the second rinse liquid flow control valve 44.

As shown in FIG. 2, each processing unit 2 includes a lower surface nozzle 45 discharging a heating liquid toward a lower surface central portion of the substrate W, a heating liquid piping 46 guiding the heating liquid to the lower surface nozzle 45, a heating liquid valve 47 opening and closing the interior of the heating liquid piping 46, a heating liquid flow control valve 48 increasing and decreasing the flow rate of the heating liquid supplied from the heating liquid piping 46 to the lower surface nozzle 45, and a heating liquid heater 49 heating the heating liquid, supplied from the heating liquid piping 46 to the lower surface nozzle 45 at a temperature (for example, of 50 to 90° C.) lower than the temperature (first temperature) of the SPM and higher than room temperature.

When the heating liquid valve 47 is opened, the heating liquid from a heating liquid supply source is supplied from the heating liquid piping 46 to the lower surface nozzle 45 at a flow rate corresponding to the opening degree of the heating liquid flow control valve 48. The heating liquid having high temperature (for example, 60° C.), which is an example of a heating fluid (heating liquid), is thereby discharged from the lower surface nozzle 45. As shown in FIG. 2, the heating liquid supplied from the lower surface nozzle 45 is heated pure water. The type of heating liquid supplied to the lower surface nozzle 45 is not restricted to pure water and may instead be carbonated water, electrolyzed ion water, hydrogen water, ozone water, IPA (isopropyl alcohol), or aqueous hydrochloric acid solution of dilute concentration (for example, approximately 10 to 100 ppm), etc.

As shown in FIG. 2 and FIG. 3, the lower surface nozzle 45 includes a disk portion 50, disposed in a horizontal attitude at a height between an upper surface central portion of the spin base 7 and the lower surface central portion of the substrate W, and a cylindrical portion 51 extending downward from the disk portion 50. The heating liquid from the heating liquid piping 46 is supplied to the interior of the cylindrical portion 51 and is discharged upward from a discharge port 45a opening at an upper surface of the disk portion 50. The disk portion 50 and the cylindrical portion 51 are not contact with a rotating portion, such as the spin shaft 9, and the lower surface nozzle 45 is fixed at a fixed position. The cylindrical portion 51 is disposed inside the cylindrical spin shaft 9. An inner peripheral surface of the spin shaft 9 surrounds an outer peripheral surface of the cylindrical portion 51 over the entire periphery and across an interval in the radial direction. As shown in FIG. 2, the inner peripheral surface of the spin shaft 9 and the outer peripheral surface of the cylindrical portion 51 define a cylindrical gas flow passage 52 that extends along the substrate rotation axis A1. An upper end of the gas flow passage 52 that serves as a gas discharge port 53 opens at the upper surface central portion of the spin base 7.

As shown in FIG. 2, each processing unit 2 includes a gas piping 54 guiding a gas from a gas supply source to the gas flow passage 52, a gas valve 55 opening and closing the interior of the gas piping 54, a gas flow control valve 56 increasing and decreasing the flow rate of the gas supplied from the gas piping 54 to the gas flow passage 52, and a gas heater 57 heating the gas, supplied from the gas piping 54 to the gas flow passage 52 at a temperature (for example, of 50 to 90° C.) lower than the temperature (first temperature) of the SPM and higher than room temperature.

When the gas valve 55 is opened, the gas from the gas supply source is supplied from the gas piping 54 to the gas flow passage 52 at a flow rate corresponding to the opening degree of the gas flow control valve 56. The gas supplied to the gas flow passage 52 flows upward inside the gas flow passage 52 and is discharged upward from the gas discharge port 53. The gas discharged from the gas discharge port 53 spreads radially between the lower surface of the substrate W and the upper surface of the spin base 7. The space between the lower surface of the substrate W and the upper surface of the spin base 7 is thereby filled with the gas having high temperature (for example, 80° C.), which is an example of a heating fluid (heating gas). The gas discharged from the gas discharge port 53 is nitrogen gas, which is an example of an inert gas. The gas is not restricted to nitrogen gas and may instead be an inert gas other than nitrogen gas or may be another gas, such as water vapor, etc.

As shown in FIG. 2, the cup 6 is disposed further outward than the substrate W held by the spin chuck 5. The cup 6 surrounds the spin base 7. When a processing liquid is supplied to the substrate W in a state where the spin chuck 5 is rotating the substrate W, the processing liquid splashes from the substrate W to a periphery of substrate W. When the processing liquid is supplied to the substrate W, an upper end portion of the upwardly open cup 6 is disposed higher than the spin base 7. The processing liquid, such as the chemical liquid, the rinse liquid, etc., that is expelled to the periphery of the substrate W is thus received by the cup 6. The processing liquid received by the cup 6 is guided to an unillustrated recovery device or drain device.

As shown in FIG. 2, the heating device includes the infrared heater 58 disposed above the substrate W held by the spin chuck 5, a heater arm 59 having a tip portion on which the infrared heater 58 mounted, and a heater moving device 60 that moves the heater arm 59 to move the infrared heater 58.

As shown in FIG. 2, the infrared heater 58 includes an infrared lamp 61 emitting light that includes infrared rays and a lamp housing 62 housing the infrared lamp 61. The infrared lamp 61 is disposed inside the lamp housing 62. As shown in FIG. 3, the lamp housing 62 is smaller than the substrate W in a plan view. The infrared heater 58 is thus smaller than the substrate W in a plan view. The infrared lamp 61 and the lamp housing 62 are mounted on the heater arm 59. The infrared lamp 61 and the lamp housing 62 thus move together with the heater arm 59.

As shown in FIG. 4, the infrared lamp 61 is connected to the controller 3. The electric power supplied to the infrared lamp 61 is adjusted by the controller 3. The infrared lamp 61 is, for example, a halogen lamp. Instead of a halogen lamp, the infrared lamp 61 may be another heat generating element, such as a carbon heater, etc. The infrared lamp 61 includes a filament and a quartz tube housing the filament. At least a portion of the lamp housing 62 is made of quartz or other material with light transmitting property and heat resistance. Therefore when the infrared lamp 61 emits light, the light from the infrared lamp 61 is transmitted through the lamp housing 62 and is radiated outward from the outer surface of the lamp housing 62.

As shown in FIG. 4, the lamp housing 62 has a bottom wall that is parallel to the upper surface of the substrate W. The infrared lamp 61 is disposed above the bottom wall. A lower surface of the bottom wall includes a substrate facing surface 58a that is parallel to the upper surface of the substrate W and is flat. In a state where the infrared heater 58 is disposed above the substrate W, the substrate facing surface 58a of the infrared heater 58 faces the upper surface of the substrate W in the up/down direction across an interval. When the infrared lamp 61 emits light in this state, the light including the infrared rays is directed from the substrate facing surface 58a toward the upper surface of the substrate W and is irradiated on the upper surface of the substrate W. The substrate facing surface 58a has, for example, a circular shape with a diameter smaller than the radius of the substrate W. The substrate facing surface 58a is not restricted to having a circular shape and may have a rectangular shape with the length in the longitudinal direction being not less than the radius of the substrate W and less than the diameter of the substrate W or may have a shape other than a circular shape or a rectangular shape.

As shown in FIG. 4, the infrared lamp 61 includes an annular portion 63 with ends that is disposed along a horizontal plane and a pair of vertical portions 64 extending upward from one end portion and another end portion of the annular portion 63. The lamp housing 62 includes a transmitting member that allows transmission of infrared rays. The transmitting member includes a cylindrical housing portion 65 that extends in the up/down direction and a disk-shaped bottom plate portion 66 that closes a lower end of the housing portion 65. The lamp housing 62 further includes a lid member 67 closing an upper end of the housing portion 65 and a supporting member 68 supporting the pair of vertical portions 64 of the infrared lamp 61. The infrared lamp 61 is supported by the lid member 67 via the supporting member 68. The annular portion 63 of the infrared lamp 61 is disposed in a space demarcated by the housing portion 65, the bottom plate portion 66, and the lid member 67. The bottom plate portion 66 is disposed below the infrared lamp 61 and faces the infrared lamp 61 in the up/down direction across an interval.

As shown in FIG. 2, the heater moving device 60 holds the infrared heater 58 at a predetermined height. As shown in FIG. 3, the heater moving device 60 rotates the heater arm 59 around a heater rotation axis A4 extending in a vertical direction at a periphery of the spin chuck 5 to move the infrared heater 58 horizontally. The irradiation position onto which the infrared rays are irradiated (a region of a portion within the upper surface of the substrate W) is thereby moved within the upper surface of the substrate W. The heater moving device 60 moves the infrared heater 58 horizontally along a path passing through the center of the substrate W in a plan view. The infrared heater 58 thus moves within a horizontal plane that includes a portion above the spin chuck 5. Also, the heater moving device 60 moves the infrared heater 58 in the vertical direction to change the distance between the substrate facing surface 58 and the substrate W.

As shown in FIG. 4, the light from the infrared heater 58 is irradiated onto the irradiation position within the upper surface of the substrate W. In the state where the infrared heater 58 is emitting infrared rays, the controller 3 makes the infrared heater 58 rotate around the heater rotation axis A4 by the heater moving device 60 while making the substrate W rotate by the spin chuck 5. The upper surface of the substrate W is thereby scanned by the irradiation position as a heating position. Therefore, when the infrared lamp 61 emits infrared rays in the state where a liquid, such as a processing liquid, etc., is held on the substrate W, the temperatures of the substrate W and the processing liquid rise.

"First Processing Example"

FIG. 5 is a time chart in outline of a first processing example performed by a processing unit 2. FIGS. 6A and 6B are a specific time chart of a portion of the first processing example. In the following, a resist removing process of removing a resist pattern, which has become unnecessary, from a substrate W shall be described with reference to FIG. 2 and FIG. 5. FIGS. 6A and 6B shall also be referenced as necessary.

When the substrate W is to be processed by the processing unit 2, a carrying-in step of carrying the substrate W into the chamber 4 is performed (step S1 of FIG. 5). Specifically, in a state where all of the nozzles, etc., are retracted from above the spin chuck 5, the controller 3 makes the hand of the substrate transfer robot CR that holds the substrate W enter inside the chamber 4. The controller 3 then makes the substrate transfer robot CR place the substrate W on the plurality of chuck pins 8. Thereafter, the controller 3 makes the hand of the substrate transfer robot CR retract from inside the chamber 4. Also, after the substrate W has been placed on the plurality of chuck pins 8, the controller 3 makes the respective chuck pins 8 move from the open positions to the closed positions. Thereafter the controller 3 starts the rotation of the substrate W by the spin motor 10.

Thereafter, a first chemical liquid supplying step (step S2 of FIG. 5) of supplying the SPM having high temperature (first temperature), which is an example of a first chemical liquid, to the substrate W is performed. Specifically, the controller 3 controls the spin motor 10 to accelerate the substrate W to a first chemical liquid rotation speed V1 (see FIGS. 6A and 6B) and makes the substrate W be rotated at the first chemical liquid rotation speed V1. That is, the controller 3 maintains the rotation speed of the substrate W at the first chemical liquid rotation speed V1. Further, the controller 3 controls the first nozzle moving device 13 to make the first chemical liquid nozzle 11 move from the retracted position to the processing position. The first chemical liquid nozzle 11 is thereby positioned above the substrate W. Thereafter, the controller 3 opens the sulfuric acid valve 19 and the first hydrogen peroxide water valve 24 to make the first chemical liquid nozzle 11 discharge the SPM having the first temperature (for example, 160° C.) toward the upper surface of the substrate W that is rotating at the first chemical liquid rotation speed V1. The controller 3 controls the first nozzle moving device 13 to make the liquid landing position of the SPM with respect to the upper surface of the substrate W move between the central portion and the peripheral edge portion in this state.

The SPM discharged from the first chemical liquid nozzle 11 lands on the upper surface of the substrate W and thereafter flows outward along the upper surface of the substrate W due to a centrifugal force. The SPM is thus supplied to the entirety of the upper surface of the substrate W and a liquid film of SPM that covers the entire upper surface of the substrate W is thereby formed on the substrate W. The resist film and the SPM are thereby made to undergo a chemical reaction and the resist film on the substrate W is removed from the substrate W by the SPM. Further, the controller 3 makes the liquid landing position of the SPM with respect to the upper surface of the substrate W move between the central portion and the peripheral edge portion in the state where the substrate W is rotating so that the liquid landing position of the SPM passes through the entire upper surface of the substrate W and the entire upper surface of the substrate W is scanned. The SPM discharged from the first chemical liquid nozzle 11 is thus supplied to the entire upper surface of the substrate W and the entire upper surface of the substrate W is processed uniformly.

Thereafter, a puddle step of holding the liquid film of SPM on the substrate W in a state where the discharge of SPM is stopped (step S3 of FIG. 5) is performed. Specifically, the controller 3 controls the spin motor 10 to decelerate the substrate W to a second chemical liquid rotation speed V2, lower than the rotation speed of the substrate W in the first chemical liquid supplying step (first chemical liquid rotation speed V1), in the state where the entire upper surface of the substrate W is covered by the liquid film of SPM (see FIGS. 6A and 6B) and makes the substrate W rotate at the second chemical liquid rotation speed V2. The centrifugal force applied to the SPM on the substrate W thus weakens and the flow rate of SPM expelled from the substrate W decreases. In the state where the substrate W is rotating at the second chemical liquid rotation speed V2, the controller 3 closes the sulfuric acid valve 19 and the first hydrogen peroxide water valve 24 to stop the discharge of SPM from the first chemical liquid nozzle 11. The liquid film of SPM that covers the entire upper surface of the substrate W is thereby held on the substrate W in the state where the discharge of SPM is stopped. After stopping the discharge of SPM, the controller 3 controls the first nozzle moving device 13 to put the first chemical liquid nozzle 11 on standby above the substrate W.

Also, a heating step (step S4 of FIG. 5) of using the infrared heater 58 to heat the substrate W and the SPM on the substrate W at a heating temperature, which is higher than the temperature (first temperature) of the SPM before the SPM is supplied to the substrate W, is performed in parallel to the first chemical liquid supplying step (step S2 of FIG. 5) and the puddle step (step S3 of FIG. 5). Specifically, the controller 3 controls the heater moving device 60 to move the infrared heater 58 from the retracted position to the processing position. The infrared heater 58 is thereby positioned above the substrate W. Thereafter, the controller 3 makes the infrared heater 58 start emitting light. The temperature of the infrared heater 58 thus rises to the heating temperature (for example, of not less than 200° C.) that is not less than the boiling point of the SPM at its current concentration and is maintained at the heating temperature.

After the infrared heater 58 starts emitting light at a position above the substrate W, the controller 3 makes the infrared heater 58 move by the heater moving device 60 to make the position of irradiation of the infrared rays with respect to the upper surface of the substrate W move within the upper surface of the substrate W. After the heating of the substrate W by the infrared heater 58 has been performed for a predetermined time, the controller 3 makes the infrared heater 58 stop emitting light in the state where the substrate W is rotating at the second chemical liquid rotation speed V2 and the liquid film of SPM covering the entire upper surface of the substrate W is held on the substrate W. Thereafter, the controller 3 controls the heater moving device 60 to retract the infrared heater 58 from above the substrate W. The emitting of light and moving of the infrared heater 58 may be performed simultaneously or the moving may be started after the emitting of light.

The controller 3 thus makes the position of irradiation of the infrared rays with respect to the upper surface of the substrate W move within the upper surface of the substrate W in the state where the substrate W is being rotated and therefore the substrate W is heated uniformly. The liquid film of SPM covering the entire upper surface of the substrate W is thus also heated uniformly. The temperature of heating of the substrate W by the infrared heater 58 is set to a temperature not less than the boiling point of the SPM at its current concentration. The SPM on the substrate W is thus heated to the boiling point at its current concentration. In particular, when the temperature of heating of the substrate W by the infrared heater 58 is set to a temperature higher than the boiling point of the SPM at its current concentration, the temperature at the interface of the substrate W and the SPM is maintained at a temperature higher than the boiling point to promote removal of foreign matter (resist film) from the substrate W.

Thereafter, a reaction liquid supplying step (step S5 of FIG. 5) of supplying hydrogen peroxide water, which is an example of a reaction liquid causing an exothermic reaction upon mixing with sulfuric acid and having a temperature before being supplied to the substrate W of less than the temperature (first temperature) of the SPM and not less than the temperature (second temperature) of a rinse liquid supplied to the substrate W in a first rinse liquid supplying step (step S7 of FIG. 5) to be described below, to the substrate W and a first temperature decrease suppressing step (step S6 of FIG. 5) of supplying pure water, which is an example of a heating fluid having a first intermediate temperature, lower than the temperature (first temperature) of the SPM and higher than the temperature (second temperature) of the rinse liquid, as the temperature before being supplied to the substrate W, to the lower surface of the substrate W are performed in parallel.

In regard to the reaction liquid supplying step, the controller 3 controls the first nozzle moving device 13 to position the first chemical liquid nozzle 11 at the intermediate position at which the processing liquid discharged from the first chemical liquid nozzle 11 lands on the upper surface intermediate portion of the substrate W. Thereafter, the controller 3 opens the second hydrogen peroxide water valve 27 to make the hydrogen peroxide water having room temperature be discharged from the first chemical liquid nozzle 11 toward the upper surface of the substrate W that is rotating at the second chemical liquid rotation speed V2. The supplying of the hydrogen peroxide water of a lower temperature than the substrate W and the SPM is thereby started at the upper surface intermediate portion of the substrate W.

As shown in FIGS. 6A and 6B, after the supplying of the hydrogen peroxide water is started at the upper surface intermediate portion of the substrate W, the controller 3 controls the first nozzle moving device 13 to move the first chemical liquid nozzle 11 from the intermediate position to the central position in the state where the substrate W is rotating at the second chemical liquid rotation speed V2. The liquid landing position of the hydrogen peroxide water is thereby moved from the upper surface intermediate portion of the substrate W to the upper surface central portion. Thereafter, the controller 3 closes the second hydrogen peroxide water valve 27 to stop the discharge of hydrogen peroxide water from the first chemical liquid nozzle 11. In succession, the controller 3 controls the first nozzle moving device 13 to make the first chemical liquid nozzle 11 retract from above the substrate W.

In regard to the first temperature decrease suppressing step, the controller 3 makes pure water of the first intermediate temperature (for example, a temperature higher than room temperature) be discharged from the lower surface nozzle 45 toward the lower surface of the substrate W that is rotating at the second chemical liquid rotation speed V2. The pure water discharged from the lower surface nozzle 45 lands on the lower surface central portion of the substrate W and thereafter flows outward along the lower surface of the substrate W to the peripheral edge of the substrate W due to a centrifugal force. The pure water is thereby supplied to the entire lower surface of the substrate W. Temperature decrease of the substrate W and the SPM is thus suppressed. After elapse of a predetermined time from the opening of the heating liquid valve 47, the controller 3 closes the heating liquid valve 47 to stop the discharge of pure water from the lower surface nozzle 45. Thereafter, the controller 3 opens and closes the gas valve 55 to make nitrogen gas be discharged temporarily from the gas discharge port 53. The pure water is thereby expelled from between the substrate W and the spin base 7.

In the reaction liquid supplying step, the hydrogen peroxide water of a lower temperature than the SPM supplied to the substrate W is discharged from the first chemical liquid nozzle 11 toward the upper surface central portion of the substrate W. The hydrogen peroxide water that lands on the upper surface central portion of the substrate W spreads along the substrate W from the liquid landing position to a periphery of the liquid landing position. Further, the hydrogen peroxide water on the substrate W flows outward along the substrate W toward the peripheral edge of the substrate W while flowing along the substrate W in a circumferential direction toward the downstream side of the rotation direction. The hydrogen peroxide water is thereby supplied to the entire upper surface of the substrate W covered by the liquid film of SPM. The hydrogen peroxide water discharged from the first chemical liquid nozzle 11 thus flows along the substrate W while taking away the heat of the substrate W and the SPM that are higher in temperature than the hydrogen peroxide water.

A portion of the SPM on the substrate W is expelled from the peripheral edge of the substrate W to the periphery thereof due to the supplying of the hydrogen peroxide water and is received by the cup 6. Also, the remaining SPM on the substrate W is diluted by the hydrogen peroxide water and gradually decreases in concentration. The entire upper surface of the substrate W is thus covered by the liquid film that contains the SPM and the hydrogen peroxide water and the proportion of the hydrogen peroxide water in the liquid film gradually increases. The sulfuric acid concentration in the SPM thus gradually decreases.

The temperatures of the substrate W and the SPM (especially the temperatures at the liquid landing position and the vicinity thereof) decrease because the hydrogen peroxide water, which is lower in temperature than the substrate W and the SPM, is supplied to the substrate W, to the substrate W. However, the sulfuric acid contained in the SPM generates heat due to reaction with the hydrogen peroxide water and therefore significant decrease of the temperatures of the substrate W and the SPM at the liquid landing position is suppressed or prevented. Further, the temperature decrease amounts of the substrate W and the SPM at the liquid landing position are reduced by the first temperature decrease suppressing step being performed in parallel to the reaction liquid supplying step. Increase of the temperature difference of the substrate W between the liquid landing position and other positions can thus be suppressed. Deformation of the substrate W due to the temperature difference can thus be suppressed and the amount of warping of the substrate W can be reduced.

In the reaction liquid supplying step, the temperatures of the substrate W and the SPM decrease gradually due to the supplying of the hydrogen peroxide water as the reaction liquid. The temperature difference of the hydrogen peroxide water with respect to the substrate W and the SPM is thus greatest when the supplying of the hydrogen peroxide water is started. The supplying of the hydrogen peroxide water is started at the upper surface intermediate portion of the substrate W at which the circumferential speed is greater than that at the upper surface central portion of the substrate W.

Therefore, the supply flow rate of the hydrogen peroxide water per unit area is lower than in a case where the supplying of the hydrogen peroxide water is started at the upper surface central portion of the substrate W. The temperatures of the substrate W and the SPM at the liquid landing position can thus be suppressed or prevented from decreasing suddenly and rapidly due to the supplying of a large amount of the hydrogen peroxide water. Further, the hydrogen peroxide water that lands on the upper surface central portion of the substrate W is expelled to the periphery of the substrate W via the upper surface peripheral edge portion of the substrate W and therefore the retention time of the hydrogen peroxide water on the substrate W is longer than in a case where the supplying of the hydrogen peroxide water is started at the upper surface peripheral edge portion of the substrate W. The hydrogen peroxide water can thus be used efficiently.

Also as shown in FIG. 2, the first chemical liquid nozzle 11 discharges the hydrogen peroxide water inwardly. Therefore the hydrogen peroxide water discharged from the first chemical liquid nozzle 11 mainly flows inwardly from the liquid landing position along the substrate W. The hydrogen peroxide water can thus be spread to a region further inward than the liquid landing position in a shorter time than in a case where the first chemical liquid nozzle 11 discharges the hydrogen peroxide water in the direction perpendicular to the upper surface of the substrate W or in a case where the first chemical liquid nozzle 11 discharges the hydrogen peroxide water outwardly. Further, the flow rate of the hydrogen peroxide water flowing inwardly from the liquid landing position is increased in comparison to these cases and the retention time of the hydrogen peroxide water on the substrate W is thus increased. The hydrogen peroxide water can thus be used efficiently.

Thereafter, the first rinse liquid supplying step (step S7 of FIG. 5) of supplying pure water having room temperature, which is an example of the rinse liquid having the second temperature, to the substrate W is performed. Specifically, the controller 3 controls the third nozzle moving device 38 to move the rinse liquid nozzle 36 from the retracted position to the processing position. Thereafter, the controller 3 opens the first rinse liquid valve 40 to make the pure water having room temperature be discharged from the rinse liquid nozzle 36 toward the upper surface central portion of the substrate W. Further, the controller 3 controls the spin motor 10 to accelerate the substrate W to a rinse rotation speed V3 greater than the first chemical liquid rotation speed V1 and the second chemical liquid rotation speed V2 (see FIGS. 6A and 6B) and makes the substrate W rotate at the rinse rotation speed V3. When a predetermined time has elapsed from the opening of the first rinse liquid valve 40, the controller 3 closes the first rinse liquid valve 40 to stop the discharge of pure water from the rinse liquid nozzle 36. Thereafter, the controller 3 controls the third nozzle moving device 38 to make the rinse liquid nozzle 36 retract from above the substrate W.

The pure water discharged from the rinse liquid nozzle 36 lands on the upper surface central portion of the substrate W that is covered by the chemical liquid or the reaction liquid. The chemical liquid on the substrate W is thus forced to flow away from the central portion to a periphery thereof. The pure water that has landed on the upper surface central portion of the substrate W flows outward along the upper surface of the substrate W due to a centrifugal force. Similarly, the chemical liquid on the substrate W flows outward along the upper surface of the substrate W due to the centrifugal force. Further, the substrate W is rotating at the rinse rotation speed V3 greater than the first chemical liquid rotation speed V1 and the second chemical liquid rotation speed V2 and therefore a greater centrifugal force is applied to the liquid on the substrate W than those applied in the first chemical liquid supplying step and the reaction liquid supplying step. The liquid film of pure water thus spreads instantly from the central portion of the substrate W to the peripheral edge of the substrate W and the chemical liquid on the substrate W is replaced by the pure water in a short time. The chemical liquid on the substrate W is thereby rinsed off by the pure water.

Thereafter, a second chemical liquid supplying step (step S8 of FIG. 5) of supplying the SC1, which is an example of a second chemical liquid having a temperature before being supplied to the substrate W of less than the temperature (first temperature) of the SPM and higher than the temperature (second temperature) of the rinse liquid, to the substrate W, and a second temperature decrease suppressing step (step S9 of FIG. 5) of supplying pure water, which is an example of a heating fluid having a second intermediate temperature, lower than the temperature (first temperature) of the SPM and higher than the temperature (second temperature) of the rinse liquid, as the temperature before being supplied to the substrate W, to the lower surface of the substrate W are performed in parallel.

In regard to the second chemical liquid supplying step, the controller 3 controls the second nozzle moving device 31 to move the second chemical liquid nozzle 29 from the retracted position to the processing position. After the second chemical liquid nozzle 29 has been positioned above the substrate W, the controller 3 opens the second chemical liquid valve 34 to make the SC1 be discharged from the second chemical liquid nozzle 29 toward the upper surface of the substrate W that is in the rotating state. In this state, the controller 3 controls the second nozzle moving device 31 to make the liquid landing position of the SC1 with respect to the upper surface of the substrate W move between the central portion and the peripheral edge portion. When a predetermined time elapses from the opening of the second chemical liquid valve 34, the controller 3 closes the second chemical liquid valve 34 to stop the discharge of the SC1. Thereafter, the controller 3 controls the second nozzle moving device 31 to make the second chemical liquid nozzle 29 retract from above the substrate W.

The SC1 discharged from the second chemical liquid nozzle 29 lands on the upper surface of the substrate W and thereafter flows outward along the upper surface of the substrate W due to the centrifugal force. The pure water on the substrate W is thus forced to flow outward by the SC1 and is expelled to a periphery of the substrate W. The liquid film of pure water on the substrate W is thereby replaced by the liquid film of SC1 that covers the entire upper surface of the substrate W. Further, the controller 3 makes the liquid landing position of the SC1 with respect to the upper surface of the substrate W move between the central portion and the peripheral edge portion in the state where the substrate W is rotating so that the liquid landing position of the SC1 passes through the entire upper surface of the substrate W and the entire upper surface of the substrate W is scanned. The SC1 discharged from the second chemical liquid nozzle 29 is thus supplied to the entire upper surface of the substrate W and the entire upper surface of the substrate W is processed uniformly.

In regard to the second temperature decrease suppressing step, the controller 3 makes pure water of the second intermediate temperature be discharged from the lower surface nozzle 45 toward the lower surface of the rotating substrate W. The pure water having high temperature is thereby supplied to the entire lower surface of the substrate W. The temperature of the substrate W, which has been decreased to the second temperature by the supplying of the rinse liquid having the second temperature, can thereby be prevented from changing locally due to the supplying of the SC1 having the temperature higher than the second temperature. After elapse of a predetermined time from the opening of the heating liquid valve 47, the controller 3 closes the heating liquid valve 47 to stop the discharge of pure water from the lower surface nozzle 45. Thereafter, the controller 3 opens and closes the gas valve 55 to make nitrogen gas be discharged temporarily from the gas discharge port 53. The pure water is thereby expelled from between the substrate W and the spin base 7.

Thereafter, a second rinse liquid supplying step (step S10 of FIG. 5) of supplying pure water having room temperature, which is an example of the rinse liquid, to the substrate W is performed. Specifically, the controller 3 controls the third nozzle moving device 38 to move the rinse liquid nozzle 36 from the retracted position to the processing position. After the rinse liquid nozzle 36 has been positioned above the substrate W, the controller 3 opens the first rinse liquid valve 40 to make the pure water be discharged from the rinse liquid nozzle 36 toward the upper surface of the substrate W that is in the rotating state. The SC1 on the substrate W is thereby forced to flow outward by the pure water and is expelled to the periphery of the substrate W. The liquid film of SC1 on the substrate W is thus replaced by the liquid film of pure water that covers the entire upper surface of the substrate W. When a predetermined time elapses from the opening of the first rinse liquid valve 40, the controller 3 closes the first rinse liquid valve 40 to stop the discharge of pure water. Thereafter the controller 3 controls the first nozzle moving device 13 to make the rinse liquid nozzle 36 retract from above the substrate W.

Thereafter a drying step (step S11 of FIG. 5) of drying the substrate W is performed. Specifically, the controller 3 controls the spin motor 10 to accelerate the substrate W to a drying rotation speed (for example of several thousand rpm) greater than the rotation speeds in the first chemical liquid supplying step (step S2 of FIG. 5) to the second rinse liquid supplying step (step S10 of FIG. 5) and makes the substrate W rotate at the drying rotation speed. A large centrifugal force is thereby applied to the liquid on the substrate W and the liquid attached to the substrate W is spun off to the periphery of the substrate W. The substrate W is thereby removed of liquid and the substrate W dries. After a predetermined time elapses from the start of high-speed rotation of the substrate W, the controller 3 controls the spin motor 10 to stop the rotation of the substrate W by the spin chuck 5.

Thereafter, a carrying-out step (step S12 of FIG. 5) of carrying out the substrate W from inside the chamber 4 is performed. Specifically, the controller 3 moves the respective chuck pins 8 from the closed positions to the open positions to release the clamping of the substrate W by the spin chuck 5. Thereafter in the state where all nozzles, etc., are retracted from above the spin chuck 5, the controller 3 makes the hand of the substrate transfer robot CR enter inside the chamber 4. The controller 3 then makes the hand of the substrate transfer robot CR hold the substrate W on the spin chuck 5. Thereafter, the controller 3 makes the hand of the substrate transfer robot CR retract from inside the chamber 4. The processed substrate W is thereby carried out of the chamber 4.

Although a case where the hydrogen peroxide water having room temperature, which is an example of the reaction liquid, is supplied to the upper surface of the substrate W in the reaction liquid supplying step was described in the above description of the first processing example, pure water having room temperature, which is an example of the reaction liquid, may be supplied instead of the hydrogen peroxide water to the upper surface of the substrate W covered by the SPM. Specifically, in place of the reaction liquid supplying step (step S5) of supplying the hydrogen peroxide water having room temperature to the substrate W, a reaction liquid supplying step (step S5a) of supplying the pure water having room temperature to the substrate W may be executed in parallel to the first temperature decrease suppressing step (step S6 of FIG. 5) as shown in FIGS. 6A and 6B.

In this case, the controller 3 controls the third nozzle moving device 38 to position the rinse liquid nozzle 36 at the intermediate position at which the rinse liquid discharged from the rinse liquid nozzle 36 lands on the upper surface intermediate portion of the substrate W. Thereafter, the controller 3 opens the second rinse liquid valve 43 to make pure water having room temperature, which has a temperature lower than the temperature (first temperature) of the SPM and causes an exothermic reaction upon mixing with sulfuric acid, be discharged from the rinse liquid nozzle 36 toward the upper surface of the substrate W that is rotating at the second chemical liquid rotation speed V2 and is covered by the liquid film of SPM. The supplying of the pure water having lower temperature than the substrate W and the SPM is thereby started at the upper surface intermediate portion of the substrate W.

As shown in FIGS. 6A and 6B, after the supplying of the pure water is started at the upper surface intermediate portion of the substrate W, the controller 3 controls the third nozzle moving device 38 to make the rinse liquid nozzle 36 move from the intermediate position to the central position in the state where the substrate W is rotating at the second chemical liquid rotation speed V2. The liquid landing position of the pure water is thereby moved from the upper surface intermediate portion of the substrate W to the upper surface central portion. Further, similarly to the case where the hydrogen peroxide water is supplied, the SPM on the substrate W is diluted by the pure water while generating heat due to the supplying of the pure water. After a predetermined time elapses from the opening of the second rinse liquid valve 43, the controller 3 closes the second rinse liquid valve 43 to stop the discharge of the pure water from the rinse liquid nozzle 36 in the state where the rinse liquid nozzle 36 is positioned at the central position. Thereafter, the controller 3 starts the first rinse liquid supplying step (step S7 of FIG. 5). That is, the controller 3 makes the substrate W rotate at the rinse rotation speed V3 in the state where the first rinse liquid valve 40 is open.

"Second Processing Example"

Figure 7B:
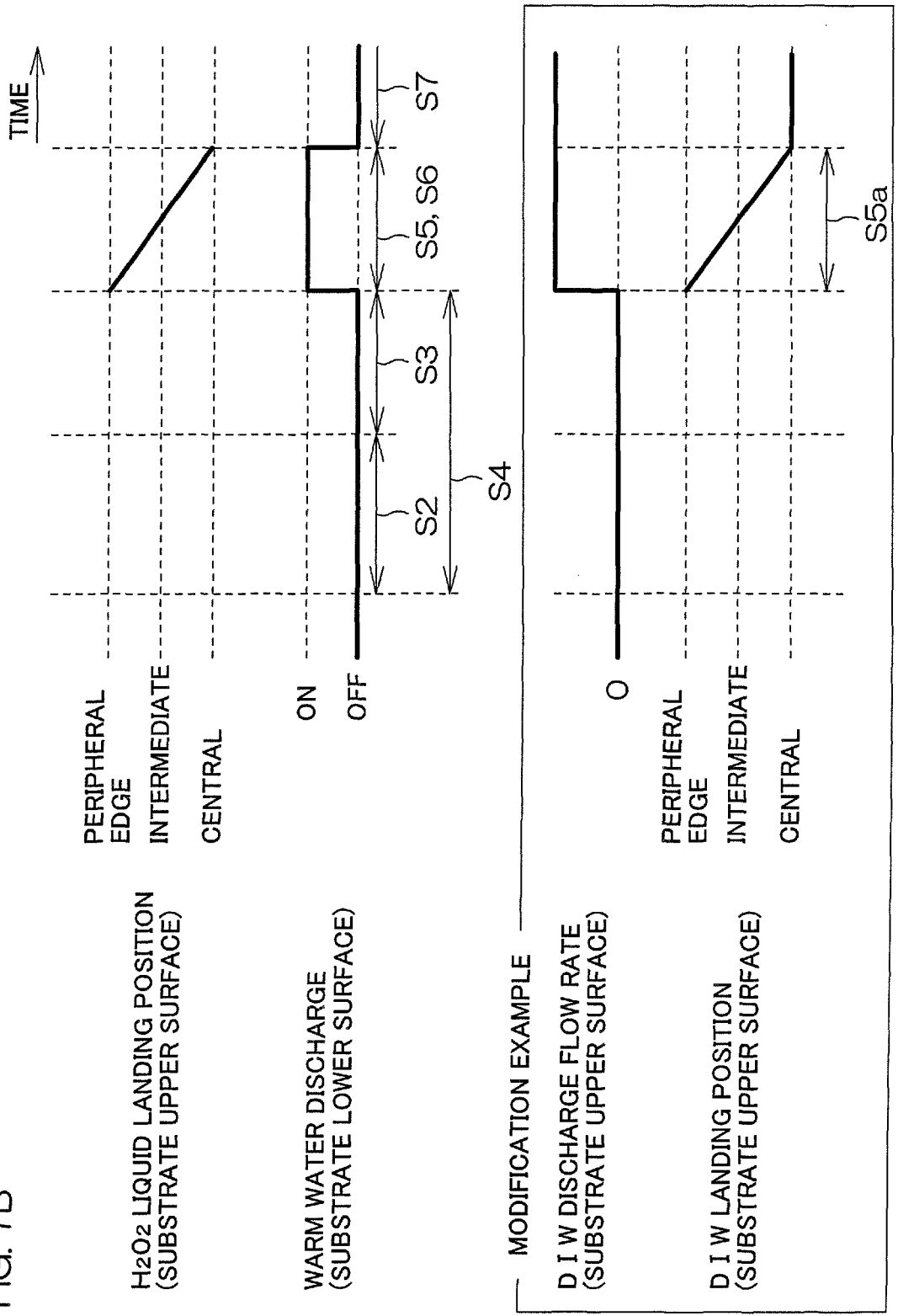

FIGS. 7A and 7B are a specific time chart of a portion of a second processing example performed by the processing unit 2. FIG. 2 and FIGS. 7A and 7B shall be referenced in the following description.

The second processing example differs from the first processing example in that in the reaction liquid supplying step, the liquid landing position of the reaction liquid with respect to the upper surface of the substrate W is moved from the peripheral edge portion to the central portion. In other words, the steps besides the reaction liquid supplying step are the same as those of the first processing example. The reaction liquid supplying step in the case where the reaction liquid is hydrogen peroxide water (step S5 of FIGS. 7A and 7B) and the reaction liquid supplying step in the case where the reaction liquid is pure water (step S5a of FIGS. 7A and 7B) shall thus be described below.

In the case where the reaction liquid is hydrogen peroxide water, the controller 3 controls the first nozzle moving device 13 to position the first chemical liquid nozzle 11 at the peripheral edge position at which the processing liquid discharged from the first chemical liquid nozzle 11 lands on the upper surface peripheral edge portion of the substrate W. Thereafter, the controller 3 opens the second hydrogen peroxide water valve 27 to make the hydrogen peroxide water having room temperature be discharged from the first chemical liquid nozzle 11 toward the upper surface of the substrate W that is rotating at the second chemical liquid rotation speed V2. The supplying of the hydrogen peroxide water of a lower temperature than the substrate W and the SPM is thereby started at the upper surface peripheral edge portion of the substrate W.

After the supplying of the hydrogen peroxide water is started at the upper surface peripheral edge portion of the substrate W, the controller 3 controls the first nozzle moving device 13 to move the first chemical liquid nozzle 11 from the peripheral edge position to the central position in the state where the substrate W is rotating at the second chemical liquid rotation speed V2. The liquid landing position of the hydrogen peroxide water is thereby moved from the upper surface peripheral edge portion of the substrate W to the upper surface central portion. Thereafter, the controller 3 closes the second hydrogen peroxide water valve 27 to stop the discharge of hydrogen peroxide water from the first chemical liquid nozzle 11. In succession, the controller 3 controls the first nozzle moving device 13 to make the first chemical liquid nozzle 11 retract from above the substrate W.

On the other hand, in the case where the reaction liquid is pure water, the controller 3 controls the third nozzle moving device 38 to position the rinse liquid nozzle 36 at the peripheral edge position at which the rinse liquid discharged from the rinse liquid nozzle 36 lands on the upper surface peripheral edge portion of the substrate W. Thereafter, the controller 3 opens the second rinse liquid valve 43 to make pure water having room temperature be discharged from the rinse liquid nozzle 36 toward the upper surface of the substrate W that is rotating at the second chemical liquid rotation speed V2. The supplying of the pure water having lower temperature than the substrate W and the SPM is thereby started at the upper surface peripheral edge portion of the substrate W.

After the supplying of the pure water is started at the upper surface peripheral edge portion of the substrate W, the controller 3 controls the third nozzle moving device 38 to make the rinse liquid nozzle 36 move from the peripheral edge position to the central position in the state where the substrate W is rotating at the second chemical liquid rotation speed V2. The liquid landing position of the pure water is thereby moved from the upper surface peripheral edge portion of the substrate W to the upper surface central portion. Therefore, similarly to the case where the hydrogen peroxide water is supplied, the SPM on the substrate W is diluted by the pure water while generating heat due to the supplying of the pure water. The controller 3 then closes the second rinse liquid valve 43 to stop the discharge of the pure water from the rinse liquid nozzle 36 in the state where the rinse liquid nozzle 36 is positioned at the central position. Thereafter, the controller 3 starts the first rinse liquid supplying step (step S7 of FIG. 5).

In the second processing example, the supplying of the reaction liquid is thus started at the upper surface peripheral edge portion of the substrate W and the temperature thus decreases gradually from the peripheral edge portion of the substrate W. The deformation of the peripheral edge portion of the substrate W, to which the clamping force of the chuck pin 8 is applied, can thus be prevented before the central portion and the intermediate portion of the substrate W. Deflection of the rotating substrate W can thereby be suppressed or prevented. Further, by moving the liquid landing position of the reaction liquid with respect to the upper surface of the substrate W toward the central portion of the substrate W, the reaction liquid can be spread across the entire upper surface of the substrate W in a short time. The deformation amount of the substrate W can thus be reduced while suppressing localized temperature decrease of the substrate W by the exothermic reaction of the SPM and the reaction liquid.

"Third Processing Example"

Figure 8:
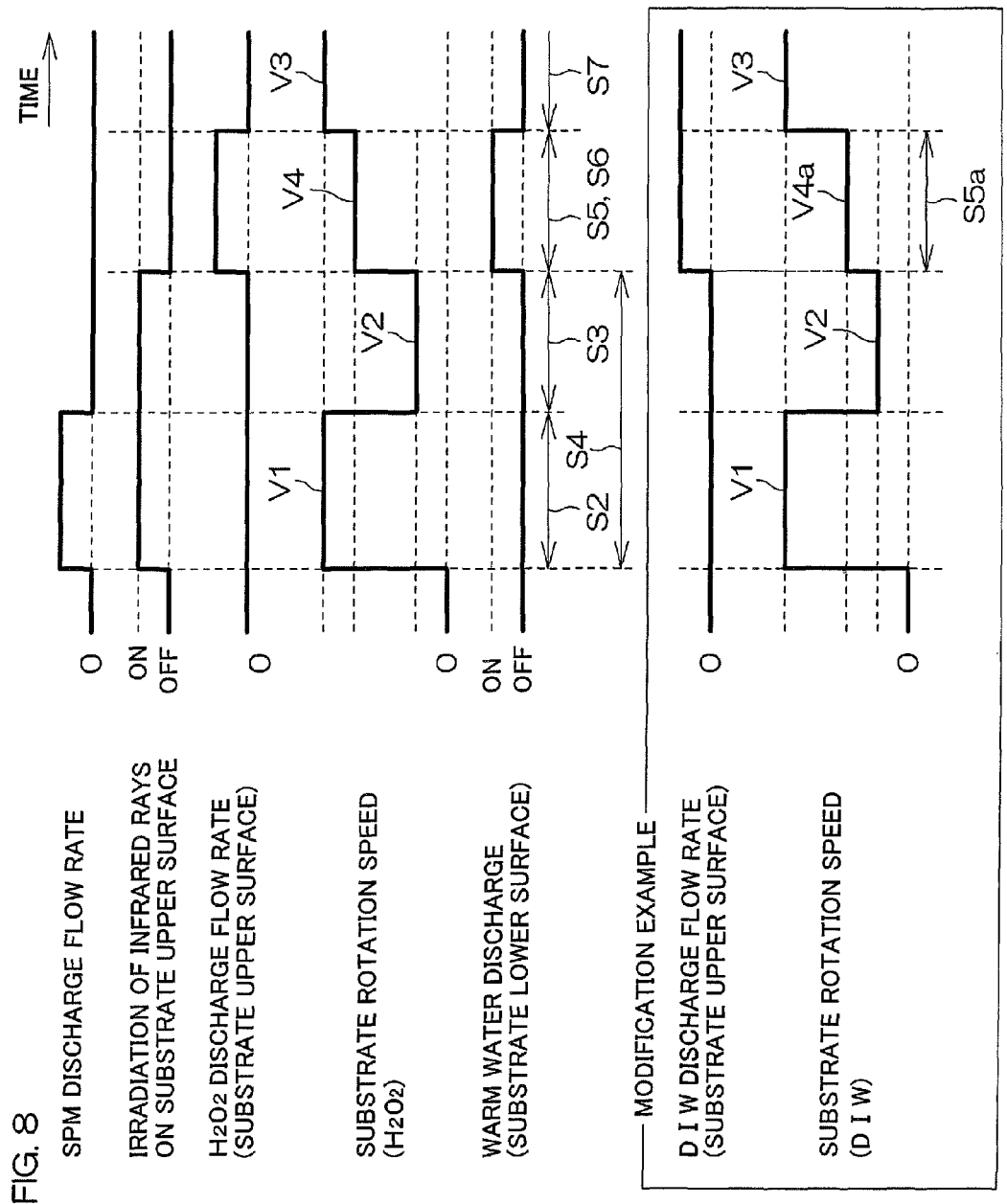
FIG. 8 is a specific time chart of a portion of a third processing example performed by the processing unit.

FIG. 8 is a specific time chart of a portion of a third processing example performed by the processing unit 2. FIG. 2 and FIG. 8 shall be referenced in the following description.

The third processing example differs from the first processing example in that the rotation speed of the substrate W in the reaction liquid supplying step is a third chemical liquid rotation speed V4 that is greater than the rotation speed V2 of the substrate W in the puddle step and less than the rotation speed V3 of the substrate W in the first rinse liquid supplying step. In other words, the steps besides the reaction liquid supplying step are the same as those of the first processing example. The reaction liquid supplying step in the case where the reaction liquid is hydrogen peroxide water (step S5 of FIG. 8) and the reaction liquid supplying step in the case where the reaction liquid is pure water (step S5a of FIG. 8) shall thus be described below.

In the case where the reaction liquid is hydrogen peroxide water, the controller 3 controls the first nozzle moving device 13 to position the first chemical liquid nozzle 11 at the intermediate position or the peripheral edge position. Thereafter, the controller 3 opens the second hydrogen peroxide water valve 27 to make the hydrogen peroxide water having room temperature be discharged from the first chemical liquid nozzle 11 toward the upper surface of the substrate W that is rotating at the second chemical liquid rotation speed V2. The supplying of the hydrogen peroxide water of a lower temperature than the substrate W and the SPM is thereby started at the upper surface intermediate portion or the upper surface peripheral edge portion of the substrate W.

After the supplying of the hydrogen peroxide water is started or at the same time that the supplying is started, the controller 3 controls the spin motor 10 to accelerate the substrate W to the third chemical liquid rotation speed V4 greater than the second chemical liquid rotation speed V2 and makes the substrate W rotate at the third chemical liquid rotation speed V4. Thereafter, the controller 3 controls the first nozzle moving device 13 to move the first chemical liquid nozzle 11 from the intermediate position or the peripheral edge position to the central position in the state where the substrate W is rotating at the third chemical liquid rotation speed V4. The liquid landing position of the hydrogen peroxide water is thereby moved from the upper surface intermediate portion or the upper surface peripheral edge portion of the substrate W to the upper surface central portion. Thereafter, the controller 3 closes the second hydrogen peroxide water valve 27 to stop the discharge of hydrogen peroxide water from the first chemical liquid nozzle 11. In succession, the controller 3 controls the first nozzle moving device 13 to make the first chemical liquid nozzle 11 retract from above the substrate W.

On the other hand, in the case where the reaction liquid is pure water, the controller 3 controls the third nozzle moving device 38 to position the rinse liquid nozzle 36 at the intermediate position or the peripheral edge position. Thereafter, the controller 3 opens the second rinse liquid valve 43 to make pure water having room temperature be discharged from the rinse liquid nozzle 36 toward the upper surface of the substrate W that is rotating at the second chemical liquid rotation speed V2. The supplying of the pure water having lower temperature than the substrate W and the SPM is thereby started at the upper surface intermediate portion or the upper surface peripheral edge portion of the substrate W.

After the supplying of the pure water is started or at the same time that the supplying is started, the controller 3 controls the spin motor 10 to accelerate the substrate W to the third chemical liquid rotation speed V4a greater than the second chemical liquid rotation speed V2 and makes the substrate W rotate at the third chemical liquid rotation speed V4a. Thereafter, the controller 3 controls the third nozzle moving device 38 to make the rinse liquid nozzle 36 move from the intermediate position or the peripheral edge position to the central position in the state where the substrate W is rotating at the third chemical liquid rotation speed V4a. The liquid landing position of the pure water is thereby moved from the upper surface peripheral edge portion of the substrate W to the upper surface central portion. Therefore, similarly to the case where the hydrogen peroxide water is supplied, the SPM on the substrate W is diluted by the pure water while generating heat due to the supplying of the pure water. The controller 3 then closes the second rinse liquid valve 43 to stop the discharge of the pure water from the rinse liquid nozzle 36 in the state where the rinse liquid nozzle 36 is positioned at the central position. Thereafter, the controller 3 starts the first rinse liquid supplying step (step S7 of FIG. 5).

FIG. 8 shows an example where, regardless of whether the reaction liquid is hydrogen peroxide water or pure water, the rotation speed (the third chemical liquid rotation speed V4 or V4a) of the substrate W is fixed during the discharge of the reaction liquid. However, the third chemical liquid rotation speed V4 or V4a does not have to be fixed.

Also, FIG. 8 shows an example where the third chemical liquid rotation speed V4a for the case where the reaction liquid is pure water is less than the third chemical liquid rotation speed V4 for the case where the reaction liquid is hydrogen peroxide water. This is because if conditions besides the type of reaction liquid are the same, the heat generation amount of the SPM is lower when the reaction liquid is pure water than when the reaction liquid is hydrogen peroxide water. By making the third chemical liquid rotation speed V4a for the case where the reaction liquid is pure water less than the third chemical liquid rotation speed V4 for the case where the reaction liquid is hydrogen peroxide water to increase the retention time of pure water on the substrate W, the heat generation amount of SPM is increased to enable sudden temperature change of the substrate W and the SPM to be suppressed favorably.

However, the present invention is not restricted to the above and the third chemical liquid rotation speed V4a for the case where the reaction liquid is pure water may be made equal to or may be made greater than the third chemical liquid rotation speed V4 for the case where the reaction liquid is hydrogen peroxide water.

"Fourth Processing Example"

Figure 9:
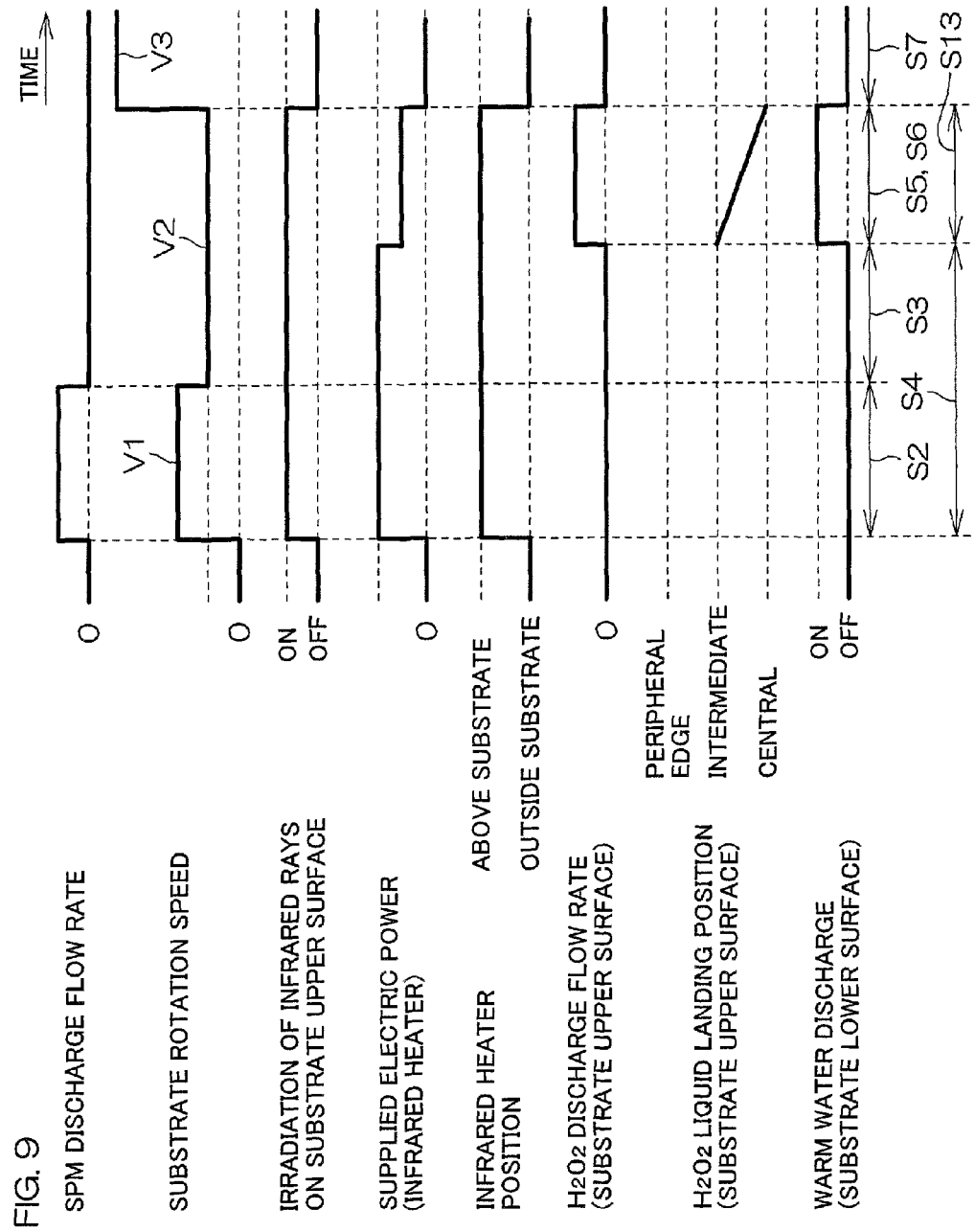
FIG. 9 is a specific time chart of a portion of a fourth processing example performed by the processing unit.

FIG. 9 is a specific time chart of a portion of a fourth processing example performed by the processing unit 2. FIG. 2 and FIG. 9 shall be referenced in the following description.

The fourth processing example differs from the first processing example in that in step S13 of FIG. 9, the reaction liquid is supplied to the substrate W while using the infrared heater 58 to heat the substrate W at a temperature lower than the heating temperature of the substrate W in the first chemical liquid supplying step (step S2 of FIG. 9) and the puddle step (step S3 of FIG. 9). In other words, besides a post-heating step (step S13 of FIG. 9), in which the infrared heater 58 is used to heat the substrate W at a post-heating temperature lower than the heating temperature of the substrate W in the heating step (step S4 of FIG. 9), being performed in parallel to the reaction liquid supplying step (step S5 of FIG. 9), the process is the same as that of the first processing example. The point of difference with respect to the first processing example shall thus mainly be described below.

After performing the heating step (step S4 of FIG. 9) of heating the substrate W and the SPM on the substrate W at the predetermined heating temperature by the infrared heater 58 disposed above the substrate W, the post-heating step (step S13 of FIG. 9), in which the infrared heater 58 is used to heat the substrate W and the liquid (a liquid including at least one among SPM, hydrogen peroxide water, and pure water) on the substrate W at the post-heating temperature lower than the heating temperature of the substrate W in the heating step, is performed in parallel to the reaction liquid supplying step (step S5 of FIG. 9).

Specifically, after the infrared heater 58 has heated the substrate W at the heating temperature in the heating step, the controller 3 decreases the electric power supplied to the infrared heater 58 to a second electric power, lower than the electric power (first electric power) in the heating step, with the hydrogen peroxide water being discharged as the reaction liquid toward the upper surface of the substrate W and the infrared heater 58 being positioned above the substrate W. The second electric power has a value less than the first electric power and not less than zero. Therefore, while making the infrared heater 58 emit light or while stopping the light emission by the infrared heater 58, the controller 3 heats the substrate W and the liquid on the substrate W at the post-heating temperature by the heat energy emitted from the infrared heater 58 or by the residual heat of the infrared heater 58. FIG. 9 illustrates a case where the second electric power has a value greater than zero and the light emission by the infrared heater 58 is being continued.

After the heating of the substrate W and the liquid on the substrate W at the post-heating temperature by the infrared heater 58 has been performed for a predetermined time, the controller 3 controls the heater moving device 60 to make the infrared heater 58 retract from above the substrate W in the state where the light emission by the infrared heater 58 is stopped. While the substrate W and the liquid on the substrate W are being heated at the post-heating temperature by the infrared heater 58, the controller 3 may move the position of heating by the infrared heater 58 by moving the infrared heater 58 above the substrate W by the heater moving device 60 or may keep the infrared heater 58 stationary above the substrate W. Also, the controller 3 may decrease the electric power supplied to the infrared heater 58 from the first electric power to the second electric power continuously or in steps. The controller 3 may stop the supply of electric power to the infrared heater 58 to heat the substrate W and the liquid on the substrate W by the residual heat of the infrared heater 58.

Also the electric power (second electric power) supplied to the infrared heater 58 in the post-heating step may include an initial electric power less than the electric power (first electric power) supplied to the infrared heater 58 in the heating step and greater than zero and a terminal electric power less than the initial electric power and not less than zero. That is, the electric power supplied to the infrared heater 58 may be decreased continuously or in steps from the initial electric power to the terminal electric power and the heat energy transmitted to the substrate W and the liquid on the substrate W in the post-heating step may be decreased with the elapse of time. In this case, the temperatures of the substrate W and the liquid on the substrate W can be decreased gradually while preventing localized temperature change in the substrate W.

As described above, with the present preferred embodiment, the chemical liquid having the first temperature (the SPM having high temperature) is supplied to the upper surface of the substrate W. The reaction liquid (the hydrogen peroxide water or the pure water having room temperature) is then supplied to the upper surface of the substrate W in the state where the chemical liquid remains on the substrate W. The reaction liquid supplied to the substrate W mixes with the chemical liquid remaining on the substrate W. The proportion of the reaction liquid in the liquid remaining on the substrate W (the liquid containing the chemical liquid and the reaction liquid) thus increases and the concentration of the chemical liquid decreases. The rinse liquid having the second temperature (the pure water having room temperature) lower than the first temperature is supplied to the upper surface of the substrate W after the reaction liquid has been supplied to the substrate W. The liquid remaining on the substrate W is thereby rinsed off.

When the supplying of the reaction liquid is started, the temperature of the substrate W approaches the temperature of the reaction liquid. The temperature of the reaction liquid before being supplied to the substrate W is lower than the temperature (first temperature) of the chemical liquid and not less than the temperature (second temperature) of the rinse liquid. Upon mixing with the chemical liquid, the reaction liquid causes an exothermic reaction in the chemical liquid. Therefore, when the reaction liquid is supplied to the upper surface of the substrate W in the state where the chemical liquid remains on the substrate W, the exothermic reaction occurs at the liquid landing position of the reaction liquid and at positions in the vicinity of the liquid landing position so that the temperature decrease amount of the substrate W is reduced in the liquid landing position vicinity region. The temperature of the substrate W thus approaches the temperature of the reaction liquid gradually. Sudden and rapid temperature decrease of the substrate W can thus be suppressed to reduce the amount of deformation of the substrate W in comparison to a case where the rinse liquid is supplied to the substrate in succession to the supplying of the chemical liquid.

Further, in parallel to the supplying of the reaction liquid to the upper surface of the substrate W, the high-temperature heating fluid (the high-temperature pure water or nitrogen gas) is supplied to the lower surface of the substrate W. The temperature of the heating fluid before being supplied to the substrate W is lower than the temperature (first temperature) of the chemical liquid and higher than the liquid temperature of the reaction liquid before being supplied to the substrate W. Localized temperature decrease of the substrate W due to the supplying of the reaction liquid is thus suppressed by the heating fluid being supplied to the substrate W in parallel to the supplying of the reaction liquid. Further, the temperature decrease of the substrate W can be suppressed without hindering the reaction of the chemical liquid and the substrate W because the heating fluid is supplied to the lower surface of the substrate W at the opposite side of the surface to which the chemical liquid and the reaction liquid are supplied.

Also in the present preferred embodiment, the supplying of the reaction liquid to the upper surface of the substrate W is started at the intermediate portion, between the central portion and the peripheral edge portion, in the state where the substrate W is rotating and the entire upper surface is covered by the chemical liquid. In succession, the liquid landing position of the reaction liquid with respect to the upper surface of the substrate W is moved from the intermediate portion to the central portion. The centrifugal force due to the rotation of the substrate W is applied to the reaction liquid and the reaction liquid supplied to the substrate W thus flows outward to the peripheral edge portion along the upper surface of the substrate W. The reaction liquid is thereby supplied to the entire upper surface of the substrate W. The proportion of the reaction liquid in the liquid film covering the entire upper surface of the substrate W thus increases gradually and the temperatures of the respective portions of the substrate W approach the temperature of the reaction liquid.

The temperature difference between the substrate W and the reaction liquid is greatest when the supplying of the reaction liquid is started. The circumferential speed (speed in the rotation direction) at the upper surface intermediate portion of the substrate W is greater than the circumferential speed at the upper surface central portion of the substrate W, and therefore, the supply flow rate of the reaction liquid per unit area is lower than in a case where the supplying of the reaction liquid is started at the upper surface central portion of the substrate W. The temperatures of the substrate W and the chemical liquid at the liquid landing position can thus be suppressed or prevented from decreasing suddenly and rapidly due to the supplying of a large amount of the reaction liquid. Further, the reaction liquid that lands on the upper surface central portion of the substrate W is expelled to the periphery of the substrate W via the upper surface peripheral edge portion of the substrate W and therefore the retention time of the reaction liquid on the substrate W is longer than in a case where the supplying of the reaction liquid is started at the upper surface peripheral edge portion of the substrate W. The reaction liquid can thus be used efficiently.

Also with the present preferred embodiment, the reaction liquid is discharged toward the upper surface of the substrate W in the direction that is inclined with respect to the upper surface of the substrate W. The reaction liquid is thus discharged obliquely with respect to the upper surface of the substrate W. The impact when the reaction liquid lands on the substrate W is thus smaller than in a case where the reaction liquid is made perpendicularly incident on the upper surface of the substrate W. In a case where a pattern is formed on the upper surface of the substrate W, if the impact applied to the substrate W is reduced, the impact applied to the pattern is reduced. Occurrence of damage, such as pattern collapse, etc., can thus be suppressed or prevented.

Also with the present preferred embodiment, the reaction liquid is discharged toward the upper surface of the substrate W in the direction that is inclined with respect to the upper surface of the substrate W so as to be positioned closer to the center of the substrate W as the direction approaches the upper surface of the substrate W. The reaction liquid thus mainly flows inwardly (toward the center of the substrate W) from the liquid landing position along the substrate W. The reaction liquid can thus be spread to a region further inward than the liquid landing position in a shorter time than in a case where the reaction liquid is discharged in the direction perpendicular to the upper surface of the substrate W or in a case where the reaction liquid is discharged in a direction that is inclined outwardly with respect to the upper surface of the substrate W. Further, the flow rate of the reaction liquid flowing inwardly from the liquid landing position is increased in comparison to these cases and the retention time of the reaction liquid on the substrate W is thus increased. The reaction liquid can thus be used efficiently.

Also with the present preferred embodiment, a reaction chemical liquid (hydrogen peroxide water) of a liquid temperature lower than the first temperature and not less than the second temperature is mixed with a heat generating chemical liquid (sulfuric acid) that generates heat upon mixing with the reaction chemical liquid. The heat generating chemical liquid and the reaction chemical liquid are thus raised in temperature to the first temperature by the heat generation of the heat generating chemical liquid to form the chemical liquid (SPM)

of the first temperature. The reaction chemical liquid as the reaction liquid is supplied to the upper surface of the substrate W in the state where the chemical liquid remains on the substrate W. The reaction chemical liquid as the reaction liquid thus mixes with the heat generating chemical liquid contained in the chemical liquid on the substrate W and an exothermic reaction occurs at the liquid landing position of the reaction liquid and at positions in its vicinity. The temperature decrease amount of the substrate W in the liquid landing position vicinity region is thus decreased. Further, a chemical liquid of the same type as a component chemical liquid (the reaction chemical liquid in the present case) contained in the chemical liquid, that is, a liquid with a high affinity to the chemical liquid is used as the reaction liquid and therefore the chemical liquid and the reaction liquid can be mixed efficiently.

Also with the third processing example, the reaction liquid is discharged toward the upper surface of the substrate W in a state where the substrate W is rotating at the relatively high rotation speed V4, that is, the rotation speed V4 that is higher than the rotation speed V2 of the substrate W in at least a portion of a period between the start of supplying of the chemical liquid to the substrate W and the start of supplying of the reaction liquid to the substrate W. The centrifugal force applied to the liquid attached to the substrate W thus increases. The chemical liquid remaining on the substrate W is thus spun off rapidly to the periphery of the substrate W and the reaction liquid supplied to the substrate W is spread across the entire upper surface of the substrate W rapidly. The temperature of the entire upper surface of the substrate W thus decreases uniformly so that the deformation of the substrate W due to temperature difference can be suppressed or prevented.

Also with the present preferred embodiment, the supplying of the heating fluid (the pure water having high temperature) to the substrate W is started after the discharge of the chemical liquid (SPM) to the substrate W is stopped. When the chemical liquid is being discharged toward the substrate W, the chemical liquid supplied before is expelled to the periphery of the substrate W. Therefore, when the heating fluid is discharged toward the substrate W in parallel to the discharge of the chemical liquid, a large amount of the chemical liquid may be mixed with the heating fluid at positions around the substrate W. Specifically, a large amount of the SPM may mix with the pure water at the periphery of the substrate W. The chemical liquid expelled from the substrate W may thus rise significantly in temperature and the cup 6 may rise significantly in temperature accordingly.

On the other hand, when the discharge of the chemical liquid is stopped, the chemical liquid expelled from the substrate W is small or zero in amount and therefore a large amount of the chemical liquid will not be mixed with the heating fluid at the periphery of the substrate W. Therefore a large amount of the SPM will not be mixed with the pure water at the periphery of the substrate W. Therefore, even in a case where the chemical liquid generates heat due to mixing with the heating fluid (for example, in a case where the chemical liquid is a liquid that contains sulfuric acid and the heating fluid is a gas or liquid that contains water), the chemical liquid expelled from the substrate W can be prevented from rising significantly in temperature. Temperature rise of the cup 6 or other cylindrical capturing member that captures the liquid expelled from the substrate W can thus be suppressed.

[Second Preferred Embodiment]

A second preferred embodiment of the present invention shall now be described. In FIG. 10 to FIG. 14 below, component portions equivalent to respective portions indicated in FIG. 1 to FIG. 9 described above are provided with the same reference symbols as in FIG. 1, etc., and description thereof shall be omitted.

Figure 10:
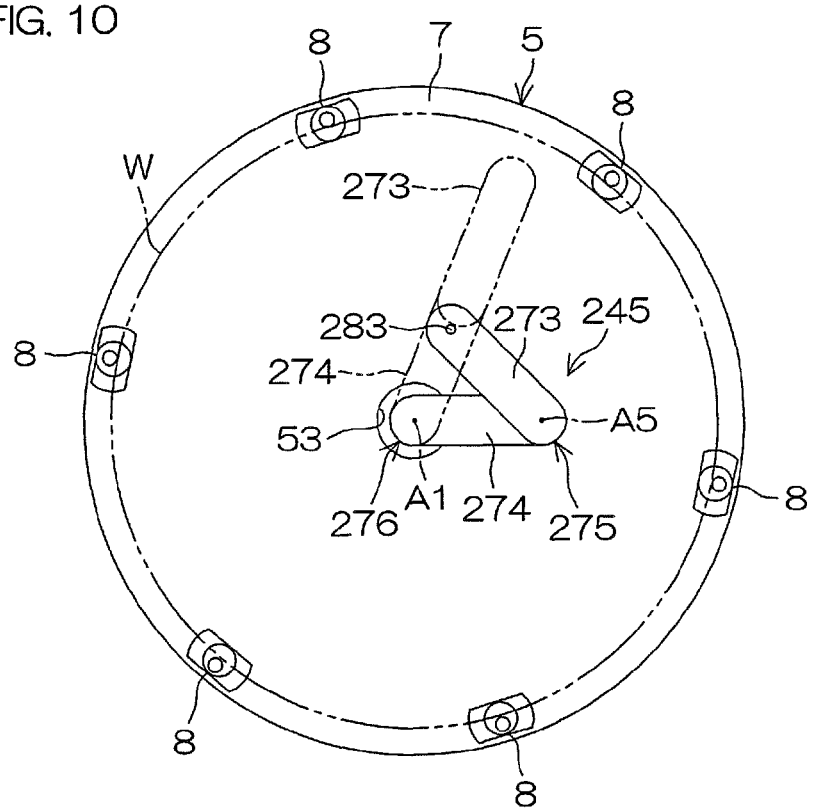
FIG. 10 is a plan view of a spin chuck according to a second preferred embodiment of the present invention.
Figure 11:
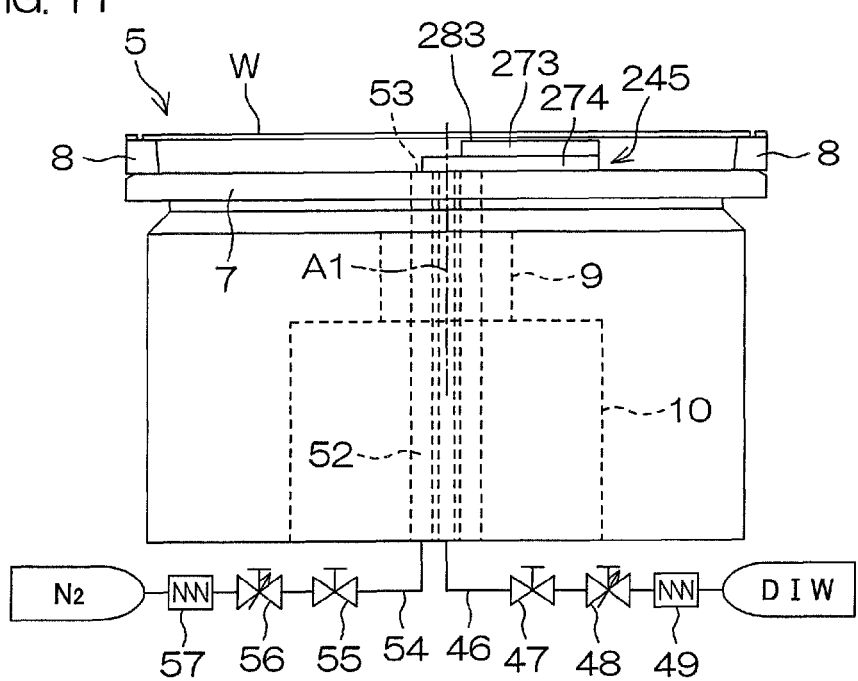
FIG. 11 is a front view of the spin chuck according to the second preferred embodiment of the present invention.
Figure 12:
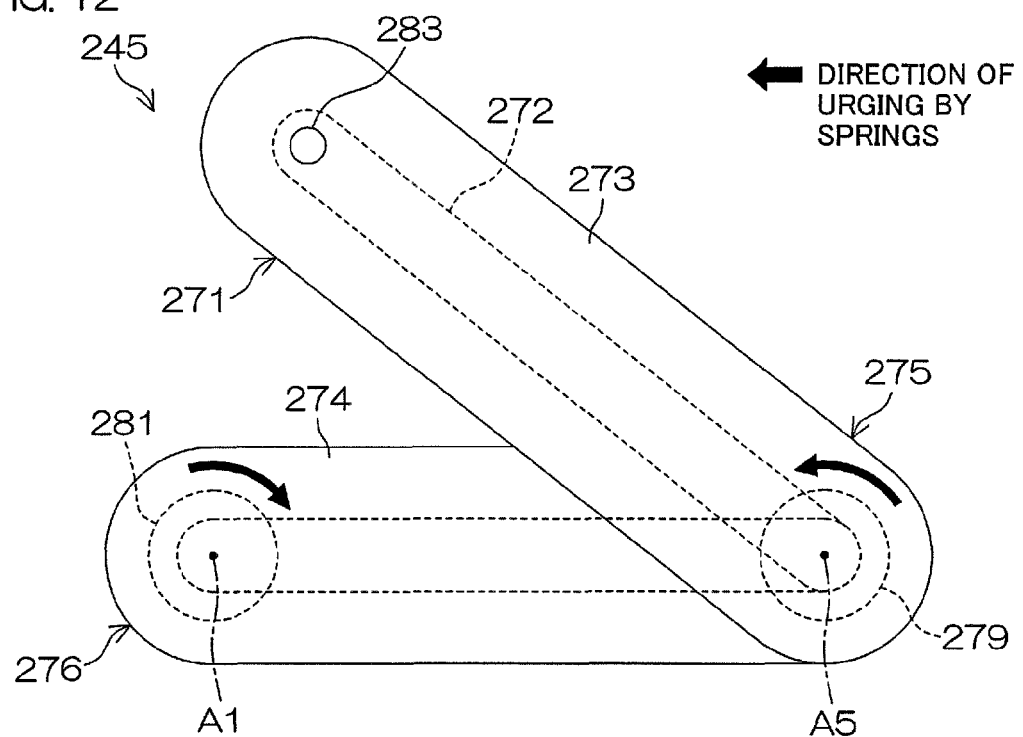
FIG. 12 is a schematic plan view of a lower surface nozzle.
Figure 13:
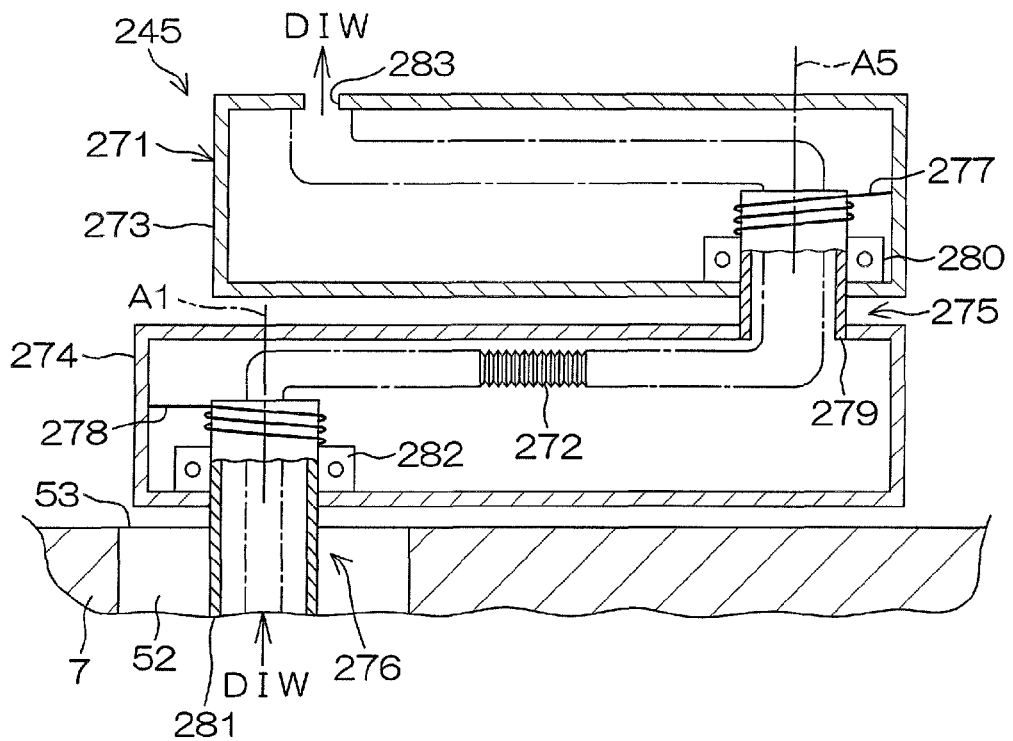
FIG. 13 is a schematic sectional view of the internal arrangement of the lower surface nozzle.

FIG. 10 is a plan view of the spin chuck 5 according to the second preferred embodiment of the present invention. FIG. 11 is a front view of the spin chuck 5 according to the second preferred embodiment of the present invention. FIG. 12 is a schematic plan view of a lower surface nozzle 245. FIG. 13 is a schematic sectional view of the internal arrangement of the lower surface nozzle 245.

As shown in FIG. 10 and FIG. 11, the processing unit 2 has, in addition to the lower surface nozzle 45 related to the first preferred embodiment, a lower surface nozzle 245 that is changeable in distance from the substrate rotation axis A1 to the liquid landing position of a processing liquid. As shown in FIG. 11 and FIG. 12, the lower surface nozzle 245 has a telescopic arm 271 capable of being extended and contracted along the lower surface of the substrate W and a telescopic piping 272 disposed in the interior of the telescopic arm 271.

As shown in FIG. 13, the telescopic arm 271 includes a plurality of hollow arm portions (a first arm portion 273 and a second arm portion 274) disposed above the spin base 7, a first joint portion 275 coupling a base portion of the first arm portion 273 and a tip portion of the second arm portion 274 so as to be relatively rotatable around a vertical flexure axis A5, and a second joint portion 276 supporting the base portion of the second arm portion 274 so as to be rotatable around the substrate rotation axis A1 with respect to the spin base 7. The telescopic arm 271 further includes a first spring 277, urging the first arm portion 273 and the second arm portion 274 around the flexure axis A5 at an urging force in accordance with the relative rotation amounts of the first arm portion 273 and the second arm portion 274 around the flexure axis A5, and a second spring 278, urging the second arm portion 274 and the spin base 7 around the substrate rotation axis A1 at an urging force in accordance with the relative rotation amounts of the second arm portion 274 and the spin base 7 around the substrate rotation axis A1.

As shown in FIG. 13, the first joint portion 275 includes a first sleeve 279 extending in the up/down direction along the flexure axis A5 and a first bearing 280 supporting the first sleeve 279 so as to be rotatable around the flexure axis A5. The first sleeve 279 is fixed to the tip portion of the second arm portion 274 and extends upward from the second arm portion 274 to the interior of the first arm portion 273. The first bearing 280 is disposed in the interior of the first arm portion 273 and is held by the first arm portion 273. The first spring 277 is wound around the first sleeve 279. One end portion of the first spring 277 is mounted on the first sleeve 279 and another end portion of the first spring 277 is mounted on the first arm portion 273. The first spring 277 is capable of extending and contracting elastically around the flexure axis A5. When the first joint portion 275 is extended from a flexed position (position shown in FIG. 12), the first arm portion 273 and the second arm portion 274 are pulled toward the flexed position by the urging force of the first spring 277 that is in accordance with the displacement amount of the first joint portion 275.

As shown in FIG. 13, the second joint portion 276 includes a second sleeve 281 extending in the up/down direction along the substrate rotation axis A1 and a second bearing 282 supporting the second sleeve 281 so as to be rotatable around the substrate rotation axis A1. The second sleeve 281 is fixed to the chamber 4 so as not to be rotatable around the substrate rotation axis A1 and extends upward from the interior of the spin base 7 to the interior of the second arm portion 274 along the substrate rotation axis A1. The second bearing 282 is disposed in the interior of the second arm portion 274 and is held by the second arm portion 274. The second spring 278 is wound around the second sleeve 281. One end portion of the second spring 278 is mounted on the second sleeve 281 and another end portion of the second spring 278 is mounted on the second arm portion 274. The second spring 278 is capable of extending and contracting elastically around the substrate rotation axis A1. When the second joint portion 276 is rotated clockwise from a flexed position (position shown in FIG. 12), the second arm portion 274 and the spin base 7 are pulled toward the flexed position by the urging force of the second spring 278 that is in accordance with the displacement amount of the second joint portion 276.

As shown in FIG. 13, the telescopic piping 272 passes through the interior of the second sleeve 281 and enters into the interior of the second arm portion 274 and further passes through the interior of the first sleeve 279 and enters into the interior of the first arm portion 273. An upper end portion of the telescopic piping 272 is fixed to a tip portion of the first arm portion 273. A fluid discharge port 283, discharging a processing liquid or a processing gas toward the lower surface of the substrate W, is provided at the tip portion of the first arm portion 273. The telescopic piping 272 is connected to the heating liquid piping 46 or the gas piping 54. FIG. 11 shows an example where the telescopic piping 272 is connected to the heating liquid piping 46. Therefore when the heating liquid valve 47 is opened, the rinse liquid (example of a heating fluid) heated to a temperature higher than room temperature by the heating liquid heater 49 is supplied from the heating liquid piping 46 to the telescopic piping 272 at a flow rate corresponding to the opening degree of the heating liquid flow control valve 48 and is discharged upward toward the lower surface of the substrate W from the fluid discharge port 283.

The supply flow rate of the processing liquid supplied from the heating liquid piping 46 to the telescopic piping 272 is increased or decreased by the controller 3 changing the opening degree of the heating liquid flow control valve 48. When the supply flow rate of the processing liquid into the telescopic piping 272 is zero or small, the telescopic piping 272 is contracted in a state of being flexed along the telescopic arm 271 as shown in FIG. 13. When the supply flow rate of the processing liquid into the telescopic piping 272 increases, a force (liquid pressure) that brings the telescopic piping 272 closer to a rectilinear state of extending rectilinearly is generated in the interior of the telescopic piping 272 and the telescopic piping 272 extends toward the rectilinear state. Also, when in a state where the telescopic piping 272 is extended (a state other than the flexed state), the supply flow rate of the processing liquid into the telescopic piping 272 is reduced, the liquid pressure inside the telescopic piping 272 decreases and the telescopic piping 272 thus contracts toward the flexed state due to the restorative force of the telescopic piping 272. The telescopic piping 272 thus extends and contracts in accordance with the supply flow rate of the processing liquid.

As indicated by solid lines in FIG. 10, when the supply flow rate of the processing liquid into the telescopic piping 272 is zero or small, the telescopic arm 271 is maintained, by the first spring 277 and the second spring 278, in a flexed state, in which the processing liquid discharged upward from the fluid discharge port 283 lands on the lower surface central portion of the substrate W. When the supply flow rate of the processing liquid into the telescopic piping 272 increases, the telescopic piping 272 tends to approach the rectilinear state and therefore a force of approaching an extended state, in which the processing liquid discharged upward from the fluid discharge port 283 lands on a lower surface peripheral edge portion of the substrate W, is applied from the telescopic piping 272 to the telescopic arm 271. Therefore as indicated by alternate long and two short dashes lines in FIG. 10, at least one of either of the first joint portion 275 and the second joint portion 276 of the telescopic arm 271 rotates against at least one of either of the first spring 277 and the second spring 278 so that the fluid discharge port 283 moves outward. Also, when the supplying of the processing liquid into the telescopic piping 272 is stopped, the telescopic arm 271 is returned to the flexed state by the restorative force of the first spring 277 and the second spring 278 and the fluid discharge port 283 moves inward.

The liquid landing position of the processing liquid with respect to the lower surface of the substrate W moves in the radial direction of the substrate W in accordance with the distance from the substrate rotation axis A1 to the fluid discharge port 283. The relationship between the supply flow rate of the processing liquid into the telescopic piping 272 and the distance from the substrate rotation axis A1 to the fluid discharge port 283 is adjusted, for example, by the spring constants of the first spring 277 and the second spring 278. As shown in FIG. 10, the spring constants of the first spring 277 and the second spring 278 are set so that the fluid discharge port 283 moves horizontally along the radius of the substrate W. The liquid landing position of the processing liquid with respect to the lower surface of the substrate W thus moves rectilinearly along the radius of the substrate W. The spring constant of the first spring 277 is, for example, less than the spring constant of the second spring 278. The first joint portion 275 is thus extended by a smaller force than the second joint portion 276. The fluid discharge port 283 thus moves in the radial direction of the substrate W in accordance with the supply flow rate of the processing liquid even when the supply flow rate is low. Further, as the supply flow rate of the processing liquid increases, the liquid landing position of the processing liquid with respect to the lower surface of the substrate W moves outward to enable the difference in supply flow rate of processing liquid per unit area to be reduced.

"Fifth Processing Example"

Figure 14:
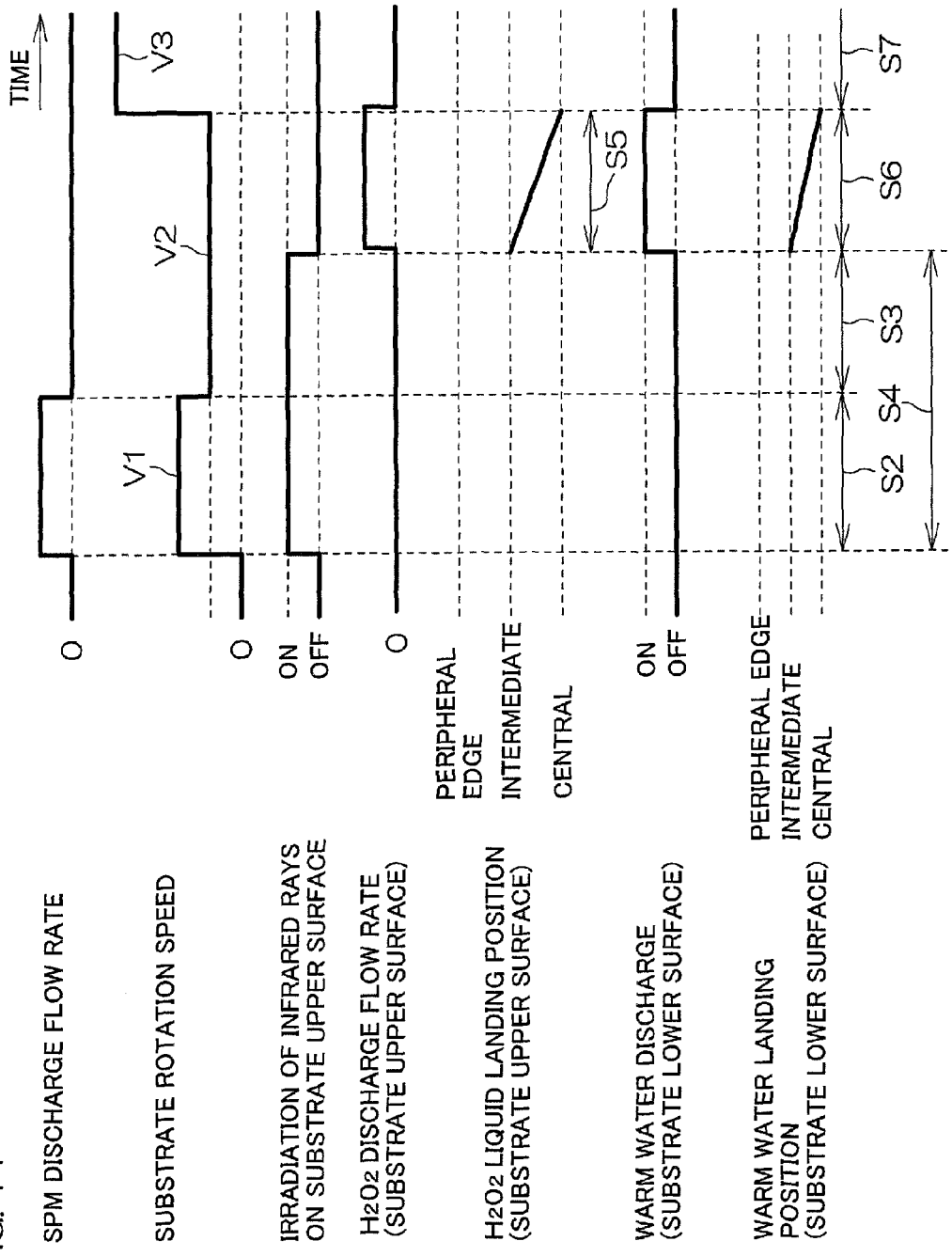
FIG. 14 is a specific time chart of a portion of a fifth processing example performed by the processing unit.

FIG. 14 is a specific time chart of a portion of a fifth processing example performed by the processing unit 2. FIG. 10, FIG. 11, and FIG. 14 shall be referenced in the following description.

The fifth processing example differs from the first processing example in that in the first temperature decrease suppressing step (step S6 of FIG. 14), the liquid landing position of the heating liquid with respect to the lower surface of the substrate W is moved in the radial direction of the substrate W. In other words, the steps besides the first temperature decrease suppressing step are the same as those of the first processing example. The point of difference with respect to the first processing example shall thus mainly be described below. Also, although in the following description, the first temperature decrease suppressing step performed in parallel to the first chemical liquid supplying step shall mainly be described, the same control as that performed for the first temperature decrease suppressing step may be performed for the second temperature decrease suppressing step performed in parallel to the second chemical liquid supplying step.

In the first temperature decrease suppressing step (step S6 of FIG. 14), the controller 3 makes the pure water, which is an example of the heating fluid (heating liquid), be discharged from the lower surface nozzle 245 toward the lower surface of the substrate W that is rotating at the second chemical liquid rotation speed V2. Temperature decrease of the substrate W and the SPM is thereby suppressed.

In the reaction liquid supplying step (step S5 of FIG. 14), the controller 3 controls the first nozzle moving device 13 to move the liquid landing position of the hydrogen peroxide water (an example of the reaction liquid) with respect to the upper surface of the substrate W from the intermediate portion to the central portion in the state where the substrate W is rotating at the second chemical liquid rotation speed V2 as shown in FIG. 14. In the first temperature decrease suppressing step (step S6 of FIG. 14), the controller 3 changes the opening degree of the heating liquid flow control valve 48, that is, changes the extension/contraction amount of the telescopic arm 271 to move the liquid landing position of the pure water (an example of the heating liquid) with respect to the lower surface of the substrate W from the intermediate portion to the central portion so as to be in synchronization with the movement of the liquid landing position of the hydrogen peroxide water from the upper surface intermediate portion to the upper surface central portion of the substrate W as shown in FIG. 14. The controller 3 then closes the second hydrogen peroxide water valve 27 and the heating liquid valve 47 to stop the discharges of hydrogen peroxide water and the pure water from the first chemical liquid nozzle 11 and the lower surface nozzle 245. Thereafter, the controller 3 opens and closes the gas valve 55 to make nitrogen gas be discharged temporarily from the gas discharge port 53. The pure water is thereby expelled from between the substrate W and the spin base 7.

The controller 3 thus controls the first nozzle moving device 13 and the heating liquid flow control valve 48 so that the distance from the substrate rotation axis A1 to the liquid landing position of the pure water is equal to the distance from the substrate rotation axis A1 to the liquid landing position of the hydrogen peroxide water. As long as the distances from the substrate rotation axis A1 are equal, the liquid landing position of the hydrogen peroxide water and the liquid landing position of the pure water may be positions that are separated in the circumferential direction of the substrate W. In the present processing example, the liquid landing position of the hydrogen peroxide water and the liquid landing position of the pure water are positions at mutually opposite sides of the substrate W. The temperature decrease of the substrate W at the liquid landing position of the hydrogen peroxide water can thus be reduced further than in a case where the liquid landing position of the pure water is fixed at the lower surface central portion of the substrate W. Further, localized temperature decrease of the substrate W can be suppressed without having to form a liquid film of the pure water that covers the entire lower surface of the substrate W and the consumption amount of pure water can thus be reduced.

As described above, with the present preferred embodiment, in parallel to moving the liquid landing position of the reaction liquid with respect to the upper surface of the substrate W, the controller 3 moves the landing position of the heating fluid with respect to the lower surface of the substrate W so that the difference between the distance from the center of the substrate W to the liquid landing position of the reaction liquid and the distance from the center of the substrate W to the landing position of the heating fluid is reduced. The heating fluid is thereby blown onto a position close to the liquid landing position of the reaction liquid. Specifically, the heating fluid is blown onto a position at the opposite side of the liquid landing position of the reaction liquid. The heat of the heating fluid is thus transmitted to the substrate W from the position at the opposite side of the liquid landing position of the reaction liquid and the temperature decrease amount at the liquid landing position of the reaction liquid and positions in the vicinity thereof is reduced further. Deformation of the substrate W due to temperature difference can thereby be suppressed or prevented.

[Third Preferred Embodiment]

Figure 15:
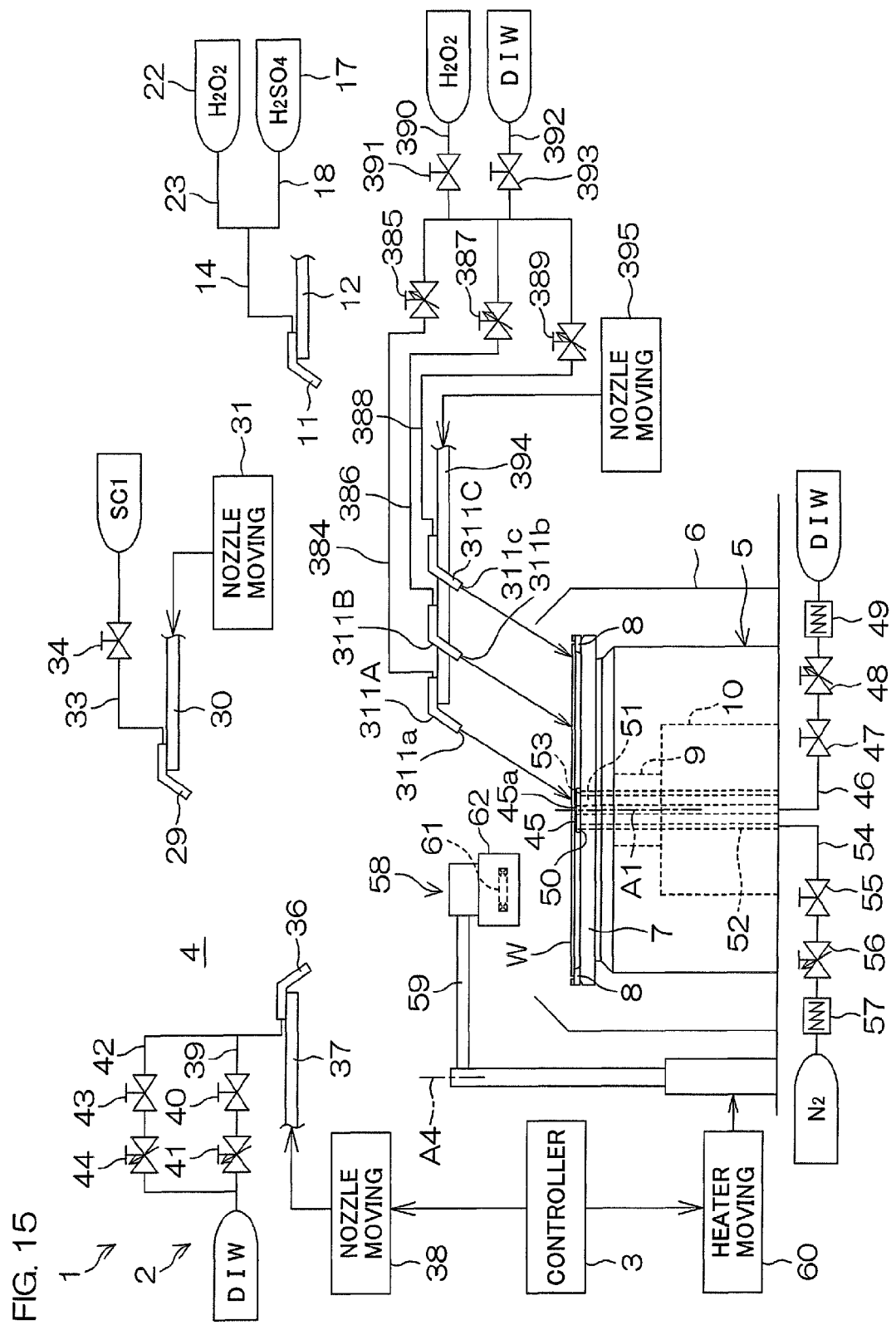
FIG. 15 is a horizontally-viewed schematic view of the interior of a chamber included in a substrate processing apparatus according to a third preferred embodiment of the present invention.

A third preferred embodiment of the present invention shall now be described. In FIG. 15 and FIGS. 16A and 16B below, component portions equivalent to respective portions indicated in FIG. 1 to FIG. 14 described above are provided with the same reference symbols as in FIG. 1, etc., and description thereof shall be omitted.

FIG. 15 is a horizontally-viewed schematic view of the interior of a chamber 4 included in a substrate processing apparatus 1 according to the third preferred embodiment of the present invention.

In addition to the arrangement according to the first preferred embodiment, the processing unit 2 further includes a central nozzle 311A having a central discharge port 311a discharging the reaction liquid toward the upper surface central portion of the substrate W, an intermediate nozzle 311B having an intermediate discharge port 311b discharging the reaction liquid toward the upper surface intermediate portion of the substrate W, and a peripheral edge nozzle 311C having a peripheral edge discharge port 311c discharging the reaction liquid toward the upper surface peripheral edge portion of the substrate W. The central nozzle 311A, the intermediate nozzle 311B, and the peripheral edge nozzle 311C are all examples of the reaction liquid nozzle that discharges the reaction liquid toward the substrate W.

The processing unit 2 further includes a central piping 384 guiding the reaction liquid to the central discharge port 311a, a central flow control valve 385 increasing and decreasing the flow rate of the reaction liquid supplied from the central piping 384 to the central discharge port 311a, an intermediate piping 386 guiding the reaction liquid to the intermediate discharge port 311b, an intermediate flow control valve 387 increasing and decreasing the flow rate of the reaction liquid supplied from the intermediate piping 386 to the intermediate discharge port 311b, a peripheral edge piping 388 guiding the reaction liquid to the peripheral edge discharge port 311c, and a peripheral edge flow control valve 389 increasing and decreasing the flow rate of the reaction liquid supplied from the peripheral edge piping 388 to the peripheral edge discharge port 311c. The processing unit 2 further includes a hydrogen peroxide water piping 390 supplying the hydrogen peroxide water having room temperature to each of the central piping 384, the intermediate piping 386, and the peripheral edge piping 388, a hydrogen peroxide water valve 391 opening and closing the interior of the hydrogen peroxide water piping 390, a pure water piping 392 supplying the pure water having room temperature to each of the central piping 384, the intermediate piping 386, and the peripheral edge piping 388, and a pure water valve 393 opening and closing the interior of the pure water piping 392.

The processing unit 2 further includes a fourth nozzle arm 394 holding the central nozzle 311A, the intermediate nozzle 311B, and the peripheral edge nozzle 311C, and a fourth nozzle moving device 395 moving the fourth nozzle arm 394 to move the central nozzle 311A, the intermediate nozzle 311B, and the peripheral edge nozzle 311C horizontally. The fourth nozzle moving device 395 moves the central nozzle 311A, the intermediate nozzle 311B, and the peripheral edge nozzle 311C horizontally between processing positions, at which the reaction liquid discharged from the central discharge port 311a, the intermediate discharge port 311b, and the peripheral edge discharge port 311c lands at the upper surface central portion, the upper surface intermediate portion, and the upper surface peripheral edge portion, respectively, of the substrate W, and retracted positions at which the central nozzle 311A, the intermediate nozzle 311B, and the peripheral edge nozzle 311C are retracted to a periphery of the spin chuck 5 in a plan view.

The central nozzle 311A, the intermediate nozzle 311B, and the peripheral edge nozzle 311C are all held by the fourth nozzle arm 394 in inwardly facing attitudes. One or more of the central nozzle 311A, the intermediate nozzle 311B, and the peripheral edge nozzle 311C may be held in a perpendicular attitude or an outwardly facing attitude. When the central nozzle 311A, the intermediate nozzle 311B, and the peripheral edge nozzle 311C are positioned at the processing positions, the central discharge port 311a, the intermediate discharge port 311b, and the peripheral edge discharge port 311c are positioned at three positions that respectively differ in rectilinear distance from the substrate rotation axis A1. The central discharge port 311a, the intermediate discharge port 311b, and the peripheral edge discharge port 311c are disposed at an equal height. One or more of the central discharge port 311a, the intermediate discharge port 311b, and the peripheral edge discharge port 311c may be disposed at a different height.

"Sixth Processing Example"

FIGS. 16A and 16B are a specific time chart of a portion of a sixth processing example performed by the processing unit 2. FIG. 15 and FIGS. 16A and 16B shall be referenced in the following description.

The sixth processing example differs from the first processing example in that in the reaction liquid supplying step, the reaction liquid is discharged toward a plurality of positions within the upper surface of the substrate W in a state where a plurality of reaction liquid nozzles are stationary. In other words, the steps besides the reaction liquid supplying step are the same as those of the first processing example. The reaction liquid supplying step in the case where the reaction liquid is hydrogen peroxide water (step S5 of FIGS. 16A and 16B) and the reaction liquid supplying step in the case where the reaction liquid is pure water (step S5a of FIGS. 16A and 16B) shall thus be described below.

In the reaction liquid supplying step, the controller 3 controls the fourth nozzle moving device 395 to move the central nozzle 311A, the intermediate nozzle 311B, and the peripheral edge nozzle 311C from the retracted positions to the processing positions in a state where the first chemical liquid nozzle 11 is retracted from above the substrate W. Thereafter, the controller 3 opens one of either of the hydrogen peroxide water valve 391 and the pure water valve 393 to make the central nozzle 311A, the intermediate nozzle 311B, and the peripheral edge nozzle 311C discharge the hydrogen peroxide water or the pure water as the reaction liquid toward the upper surface of the substrate W that is rotating at the second chemical liquid rotation speed V2. The supplying of the reaction liquid having lower temperature than the substrate W and the SPM is thereby started at the upper surface central portion, the upper surface intermediate portion, and the upper surface peripheral edge portion of the substrate W.

The discharge flow rates of the reaction liquid from the central nozzle 311A, the intermediate nozzle 311B, and the peripheral edge nozzle 311C in the reaction liquid supplying step may be equal or different. For example, the opening degrees of the central flow control valve 385, the intermediate flow control valve 387, and the peripheral edge flow control valve 389 may be adjusted by the controller 3 so that the discharge flow rate increases in the order of the central nozzle 311A, the intermediate nozzle 311B, and the peripheral edge nozzle 311C. In this case, the supply flow rate of the processing liquid with respect to the upper surface of the substrate W increases in the order of the central portion, the intermediate portion, and the peripheral edge portion to enable the difference in supply flow rate of the processing liquid per unit area to be reduced. Localized temperature decrease of the substrate W can thereby be suppressed.

The controller 3 continues the supplying of the reaction liquid to the upper surface of the substrate W for a predetermined time with the central nozzle 311A, the intermediate nozzle 311B, and the peripheral edge nozzle 311C being made stationary above the substrate W. Thereafter, the controller 3 closes the open valve among the hydrogen peroxide water valve 391 and the pure water valve 393 to stop the discharge of the reaction liquid from the central nozzle 311A, the intermediate nozzle 311B, and the peripheral edge nozzle 311C. The controller 3 then starts the first rinse liquid supplying step (step S7 of FIG. 5). The central nozzle 311A, the intermediate nozzle 311B, and the peripheral edge nozzle 311C are connected to a pure water supply source and therefore the controller 3 may perform the first rinse liquid supplying step using the central nozzle 311A, the intermediate nozzle 311B, and the peripheral edge nozzle 311C instead of performing the first rinse liquid supplying step using the rinse liquid nozzle 36.

As described above, with the present preferred embodiment, in the state where the substrate W is rotating, the reaction liquid is discharged simultaneously toward a plurality of positions within the upper surface of the substrate W that respectively differ in distance from the center of the substrate W. More specifically, the reaction liquid is discharged simultaneously toward the upper surface central portion, the upper surface intermediate portion, and the upper surface peripheral edge portion of the substrate W. Therefore, when the substrate W rotates by one turn or more, the reaction liquid is spread across the entire upper surface of the substrate W. The reaction liquid is thus spread across the entire upper surface of the substrate W in a short time and the temperature of the entire upper surface of the substrate W decreases uniformly. Deformation of the substrate W due to temperature difference can thereby be suppressed or prevented.

Figure 17:
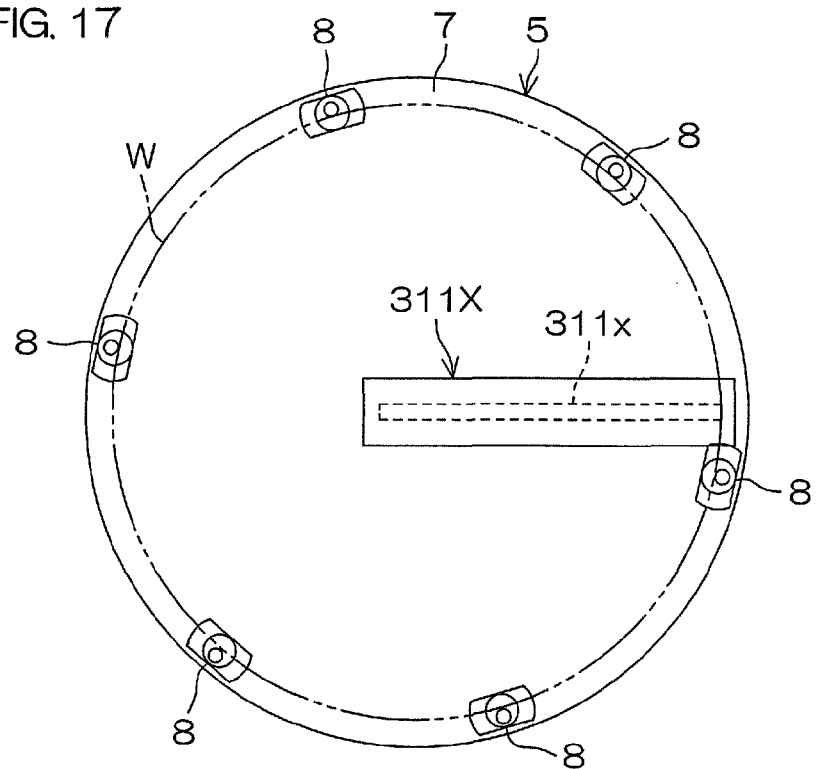
FIG. 17 is a schematic plan view of a modification example of a reaction liquid nozzle.

Although with FIG. 15, an example where the processing unit 2 is provided with a plurality of reaction liquid nozzles (the central nozzle 311A, the intermediate nozzle 311B, and the peripheral edge nozzle 311O) was described, the processing unit 2 may instead have a single reaction liquid nozzle that discharges the reaction liquid simultaneously toward a plurality of positions within the upper surface of the substrate W that respectively differ in distance from the center of the substrate W. In this case, the processing unit 2 may include a reaction liquid nozzle 311x having a slit-shaped discharge port 311x extending in the radial direction from the upper surface central portion of the substrate W to the upper surface peripheral edge portion of the substrate W in a plan view as shown in FIG. 17. Or, the processing unit 2 may include a reaction liquid nozzle 311Y having a plurality of discharge ports 311y aligned in the radial direction of the substrate W from the upper surface central portion of the substrate W to the upper surface peripheral edge portion of the substrate W in a plan view as shown in FIG. 18.

Figure 18:
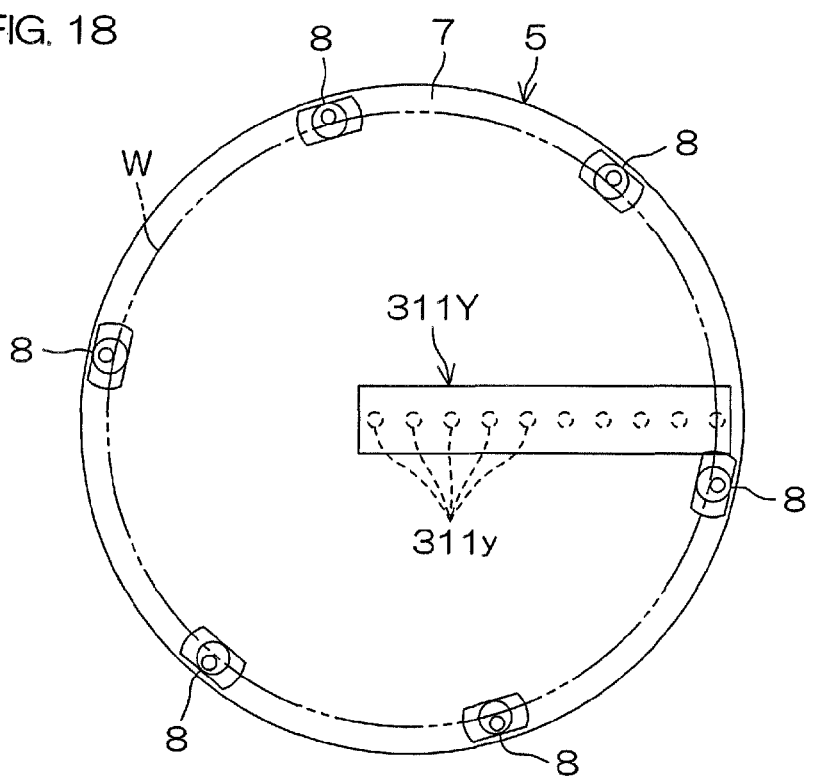
FIG. 18 is a schematic plan view of another modification example of the reaction liquid nozzle.

With each of the arrangements shown in FIG. 17 and FIG. 18, the reaction liquid is discharged simultaneously toward the entirety of a region that is within the upper surface of the substrate W and includes the radius of the substrate W and lands simultaneously on the entire region in the state where the substrate W is rotating. That is, the reaction liquid is supplied simultaneously to the entire region that is continuous in the radial direction of the substrate W from the center of the substrate W to the peripheral edge of the substrate W.

Therefore when the substrate W rotates by one turn or more, the reaction liquid is spread across the entire upper surface of the substrate W. The reaction liquid is thus spread across the entire upper surface of the substrate W in a short time and the temperature of the entire upper surface of the substrate W decreases uniformly. Deformation of the substrate W due to temperature difference can thereby be suppressed or prevented.

[Other Preferred Embodiments]

Although the preferred embodiments of the present invention have been described above, the present invention is not restricted to the contents of the above-described preferred embodiments and various modifications are possible within the scope of the present invention.

For example, although with each of the processing examples described above, the case where the puddle step of making the substrate W and the SPM react is performed in the state where the discharge of SPM from the first chemical liquid nozzle 11 is stopped was described, the puddle step may be omitted and the reaction liquid supplying step may be started in succession to the end of the first chemical liquid supplying step.

Also, although with each of the processing examples, the case where the substrate W and the SPM are heated by the infrared heater 58 was described, the heating step of heating the substrate W and the SPM by the infrared heater 58 (step S4 of FIG. 5) may be omitted.

Also, although with each of the processing examples, the case where the first temperature decrease suppressing step is started at the same time as the reaction liquid supplying step (step S5 of FIG. 5) was described, the first temperature decrease suppressing step (step S6 of FIG. 5) may be started before the start or after the start of the reaction liquid supplying step. Similarly, the second temperature decrease suppressing step (step S9 of FIG. 5) may be started before the start or after the start of the second chemical liquid supplying step (step S8 of FIG. 5).

Also, although with each of the processing examples, the case where the second temperature decrease suppressing step (step S9 of FIG. 5) is started after the first temperature decrease suppressing step (step S6 of FIG. 5) is ended, that is, after the discharge of the heating fluid is stopped was described, the discharge of the heating fluid may be continued from the start of the reaction liquid supplying step (step S5 of FIG. 5) to the end of the second chemical liquid supplying step (step S8 of FIG. 5).

Also, although with each of the processing examples, the case where the processing unit 2 performs the resist removing process was described, the process performed by the processing unit 2 is not restricted to the resist removing process and may be another process, such as a cleaning process or an etching process, etc.

Also, although with each of the preferred embodiments described above, the case where the spin chuck 5 is a clamping type chuck that includes the plurality of chuck pins 8 was described, the spin chuck 5 may instead be a vacuum type chuck with which the lower surface (rear surface) of the substrate W is suctioned onto an upper surface of a spin base (suction base).

Also, although with each of the preferred embodiments, the case where the first chemical liquid nozzle 11, the second chemical liquid nozzle 29, and the rinse liquid nozzle 36 are mounted on separate nozzle arms was described, two or more of the nozzles may be mounted on a nozzle arm in common. Similarly, the infrared heater 58 may be mounted on an arm in common with the first chemical liquid nozzle 11 or other processing liquid nozzle that discharges a processing liquid.

Also, although with each of the preferred embodiments, the case where two pipings (the first hydrogen peroxide water piping 23 and the second hydrogen peroxide water piping 26) that supply the hydrogen peroxide water to the first chemical liquid nozzle 11 are provided was described, one of these pipings may be omitted. Similarly, although the case where two pipings (the first rinse liquid piping 39 and the second rinse liquid piping 42) that supply the rinse liquid to the rinse liquid nozzle 36 are provided was described, one of these pipings may be omitted.

Also, although with each of the preferred embodiments, the case where the temperature of the reaction liquid (hydrogen peroxide water or pure water) before being supplied to the substrate is room temperature was described, the temperature of the reaction liquid before being supplied to the substrate may be higher than room temperature as long as it is lower than the temperature (first temperature) of the SPM before being supplied to the substrate.

Also, although with each of the preferred embodiments, the case where warm water (pure water heated to the first intermediate temperature), which is an example of the heating liquid, is supplied to the lower surface of the substrate W was described, a heating gas may be supplied instead of a heating liquid to the lower surface of the substrate W.

Specifically, in at least one of either of the first temperature decrease suppressing step (step S6 of FIG. 5) or the second temperature decrease suppressing step (step S9 of FIG. 5), the controller 3 may open the gas valve 55 to make nitrogen gas of the first intermediate temperature (for example, a temperature higher than room temperature) be discharged from the gas discharge port 53 that opens at the upper surface central portion of the spin base 7. In this case, the nitrogen gas discharged from the gas discharge port 53 spreads radially in the space between the lower surface of the substrate W and the upper surface of the spin base 7 from the upper surface central portion of the spin base 7. The space between the lower surface of the substrate W and the upper surface of the spin base 7 is thereby filled with the nitrogen gas of the first intermediate temperature and the temperature decrease of the substrate W is suppressed by the nitrogen gas, which is an example of the heating gas.

Also, although with each of the preferred embodiments, the case where the substrate processing apparatus 1 is an apparatus that processes the disk-shaped substrates W was described, the substrate processing apparatus 1 may instead be an apparatus that processes polygonal substrates W, such as substrates for liquid crystal displays, etc.

Also, any two or more of the preferred embodiments described above may be combined.

The present application corresponds to Japanese Patent Application No. 2013-181509 filed on Sep. 2, 2013 in the Japan Patent Office, and the entire disclosure of this application is incorporated herein by reference.

While preferred embodiments of the present invention have been described in detail above, these are merely specific examples used to clarify the technical contents of the present invention, and the present invention should not be interpreted as being limited only to these specific examples, and the spirit and scope of the present invention shall be limited only by the appended claims.

What is claimed is:

1. A substrate processing method comprising:
a chemical liquid supplying step of supplying a chemical liquid having a first temperature to a major surface of a substrate;
a rinse liquid supplying step of supplying, after the chemical liquid supplying step, a rinse liquid having a second temperature lower than the first temperature to the major surface of the substrate to rinse off a liquid remaining on the substrate;

a reaction liquid supplying step of supplying, after the chemical liquid supplying step and before the rinse liquid supplying step, a reaction liquid, causing an exothermic reaction upon mixing with the chemical liquid and having a liquid temperature lower than the first temperature and not less than the second temperature, to the major surface of the substrate in a state where the chemical liquid supplied to the substrate in the chemical liquid supplying step remains on the substrate; and a temperature decrease suppressing step of supplying, in parallel to the reaction liquid supplying step, a heating fluid having a temperature lower than the first temperature and higher than the liquid temperature of the reaction liquid to the other major surface of the substrate at an opposite side of the major surface of the substrate to which the chemical liquid is supplied in the chemical liquid supplying step, wherein the temperature decrease suppressing step is started after the discharge of the chemical liquid onto the substrate in the chemical liquid supplying step is stopped.

2. The substrate processing method according to claim 1, wherein
the reaction liquid supplying step includes a step of supplying the reaction liquid to the major surface of the substrate by causing a reaction liquid nozzle to discharge the reaction liquid from a plurality of discharge ports of the reaction liquid nozzle.

3. The substrate processing method according to claim 1, wherein the reaction liquid is hydrogen peroxide water or pure water.

4. The substrate processing method according to claim 1, wherein the reaction liquid supplying step includes a step of moving a liquid landing position of the reaction liquid with respect to the major surface of the substrate by moving a reaction liquid nozzle that discharges the reaction liquid, and
the temperature decrease suppressing step includes a step of moving a landing position of the heating fluid with respect to the other major surface of the substrate by moving a nozzle that discharges the heating fluid such that a difference between the distance from a center of the substrate to the liquid landing position of the reaction liquid and the distance from the center of the substrate to the landing position of the heating fluid is reduced.

5. The substrate processing method according to claim 4, wherein the temperature decrease suppressing step includes a step of moving the landing position of the heating fluid with respect to the other major surface of the substrate by moving the nozzle that discharges the heating fluid such that the landing position of the heating fluid with respect to the other major surface of the substrate and the liquid landing position of the reaction liquid with respect to the major surface of the substrate opposes each other via the substrate, when the liquid landing position of the reaction liquid with respect to the major surface of the substrate is moved.

6. A substrate processing method comprising:
a chemical liquid supplying step of supplying a chemical liquid having a first temperature to a major surface of a substrate;

a rinse liquid supplying step of supplying, after the chemical liquid supplying step, a rinse liquid having a second temperature lower than the first temperature to the major surface of the substrate to rinse off a liquid remaining on the substrate;

a reaction liquid supplying step of supplying, after the chemical liquid supplying step and before the rinse liquid supplying step, a reaction liquid, causing an exothermic reaction upon mixing with the chemical liquid and having a liquid temperature lower than the first temperature and not less than the second temperature, to the major surface of the substrate in a state where the chemical liquid supplied to the substrate in the chemical liquid supplying step remains on the substrate; and a temperature decrease suppressing step of supplying, in parallel to the reaction liquid supplying step, a heating fluid having a temperature lower than the first temperature and higher than the liquid temperature of the reaction liquid to the other major surface of the substrate at an opposite side of the major surface of the substrate to which the chemical liquid is supplied in the chemical liquid supplying step, wherein the reaction liquid supplying step includes a step of moving a liquid landing position of the reaction liquid with respect to the major surface of the substrate by moving a reaction liquid nozzle that discharges the reaction liquid, and the temperature decrease suppressing step includes a step of moving a landing position of the heating fluid with respect to the other major surface of the substrate by moving a nozzle that discharges the heating fluid such that a difference between the distance from a center of the substrate to the liquid landing position of the reaction liquid and the distance from the center of the substrate to the landing position of the heating fluid is reduced.

7. The substrate processing method according to claim 6, wherein the temperature decrease suppressing step includes a step of moving the landing position of the heating fluid with respect to the other major surface of the substrate by moving the nozzle that discharges the heating fluid such that the landing position of the heating fluid with respect to the other major surface of the substrate and the liquid landing position of the reaction liquid with respect to the major surface of the substrate opposes each other via the substrate, when the liquid landing position of the reaction liquid with respect to the major surface of the substrate is moved.

* * * * *